US010763583B2

United States Patent
Linn et al.

(10) Patent No.: US 10,763,583 B2
(45) Date of Patent: Sep. 1, 2020

(54) METHOD TO ASSEMBLE APERTURE SEGMENTS OF A CYLINDRICAL FEED ANTENNA

(71) Applicant: Kymeta Corporation, Redmond, WA (US)

(72) Inventors: Steven Linn, Redmond, WA (US); Robert Morey, Redmond, WA (US); Stephen Olfert, Redmond, WA (US); Andrew Turner, Redmond, WA (US); Matthew Riley, Redmond, WA (US); Jonathan Mallari, Redmond, WA (US); Colin Stuart Short, Redmond, WA (US)

(73) Assignee: KYMETA CORPORATION, Redmond, WA (US)

( * ) Notice: Subject to any disclaimer, the term of this patent is extended or adjusted under 35 U.S.C. 154(b) by 537 days.

(21) Appl. No.: 15/591,018

(22) Filed: May 9, 2017

(65) Prior Publication Data
US 2017/0331186 A1    Nov. 16, 2017

Related U.S. Application Data

(60) Provisional application No. 62/334,231, filed on May 10, 2016.

(51) Int. Cl.
*H01Q 3/36*      (2006.01)
*H01Q 19/17*     (2006.01)
(Continued)

(52) U.S. Cl.
CPC ............... *H01Q 3/36* (2013.01); *H01Q 3/242* (2013.01); *H01Q 3/28* (2013.01); *H01Q 3/40* (2013.01);
(Continued)

(58) Field of Classification Search
CPC ............ H01Q 3/242; H01Q 3/28; H01Q 3/36; H01Q 3/40; H01Q 19/175; H01Q 21/0012;
(Continued)

(56) References Cited

U.S. PATENT DOCUMENTS

| 5,175,554 A | 12/1992 | Mangiapane et al. |
| 6,388,621 B1 | 5/2002 | Lynch |

(Continued)

FOREIGN PATENT DOCUMENTS

| CN | 101625730 | 1/2010 |
| EP | 2071669 | 6/2009 |

(Continued)

OTHER PUBLICATIONS

European Search Report for Application No. 17796768.4, dated Dec. 10, 2019, 9 pages.
(Continued)

*Primary Examiner* — Peter Dungba Vo
*Assistant Examiner* — Joshua D Anderson
(74) *Attorney, Agent, or Firm* — Womble Bond Dickinson (US) LLP

(57) ABSTRACT

A method of assembling an antenna aperture from a plurality of antenna aperture segments is described. The method may include placing a first aperture segment relative to a second aperture segment to partially form the antenna aperture. Furthermore, an overlap of the first aperture segment overlaps a complementary underlap of the second aperture segment at a seam. The method may also include joining the overlap of the first aperture segment to the underlap of the second aperture segment to partially form the antenna aperture.

22 Claims, 21 Drawing Sheets

(51) Int. Cl.
*H01Q 21/00* (2006.01)
*H01Q 21/20* (2006.01)
*H01Q 3/24* (2006.01)
*H01Q 3/28* (2006.01)
*H01Q 3/40* (2006.01)
*H05K 13/04* (2006.01)

(52) U.S. Cl.
CPC ......... *H01Q 19/175* (2013.01); *H01Q 21/005* (2013.01); *H01Q 21/0087* (2013.01); *H01Q 21/205* (2013.01); *H05K 13/0469* (2013.01); *Y10T 29/49016* (2015.01); *Y10T 29/49131* (2015.01)

(58) Field of Classification Search
CPC ............. H01Q 21/0025; H01Q 21/005; H01Q 21/0087; H01Q 21/205; Y10T 29/49016; Y10T 29/49128; Y10T 29/49131; Y10T 29/53191; H05K 13/0469
See application file for complete search history.

(56) References Cited

U.S. PATENT DOCUMENTS

| | | | |
|---|---|---|---|
| 7,233,297 B1 | 6/2007 | Harvey | |
| 8,665,174 B2 * | 3/2014 | McCarthy | H01Q 1/28 343/810 |
| 2004/0070536 A1 | 4/2004 | Stotler | |
| 2010/0001906 A1 | 1/2010 | Akkermans | |
| 2014/0354498 A1 | 12/2014 | Balma et al. | |
| 2015/0236415 A1 | 8/2015 | Bily et al. | |
| 2015/0303586 A1 * | 10/2015 | Hafenrichter | H01Q 1/40 343/873 |
| 2016/0261043 A1 | 9/2016 | Sazegar et al. | |

FOREIGN PATENT DOCUMENTS

| | | |
|---|---|---|
| EP | 2144329 | 1/2010 |
| EP | 2919323 | 9/2015 |
| WO | 2013092821 | 6/2013 |
| WO | 2015/126550 | 8/2015 |

OTHER PUBLICATIONS

Chinese Office Action for Application No. 201780037752.7 dated Jan. 6, 2020, 6 pages.

PCT Application No. PCT/US2017/031972, International Search Report and the Written Opinion, dated Aug. 4, 2017, 13 pgs.

* cited by examiner

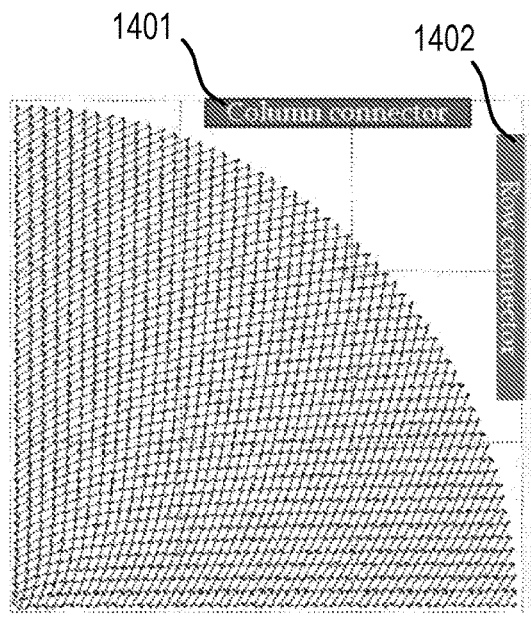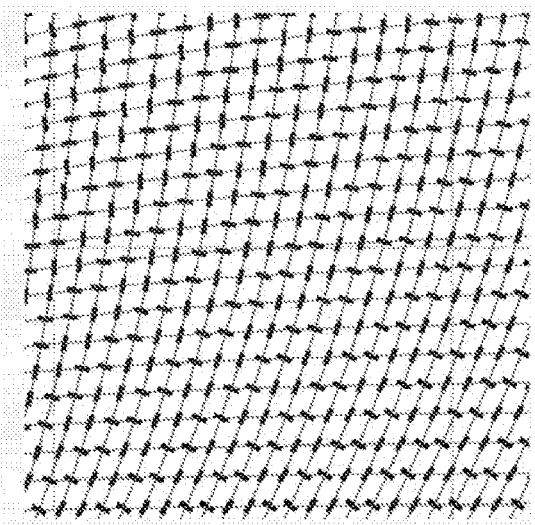
FIG. 14A              FIG. 14B
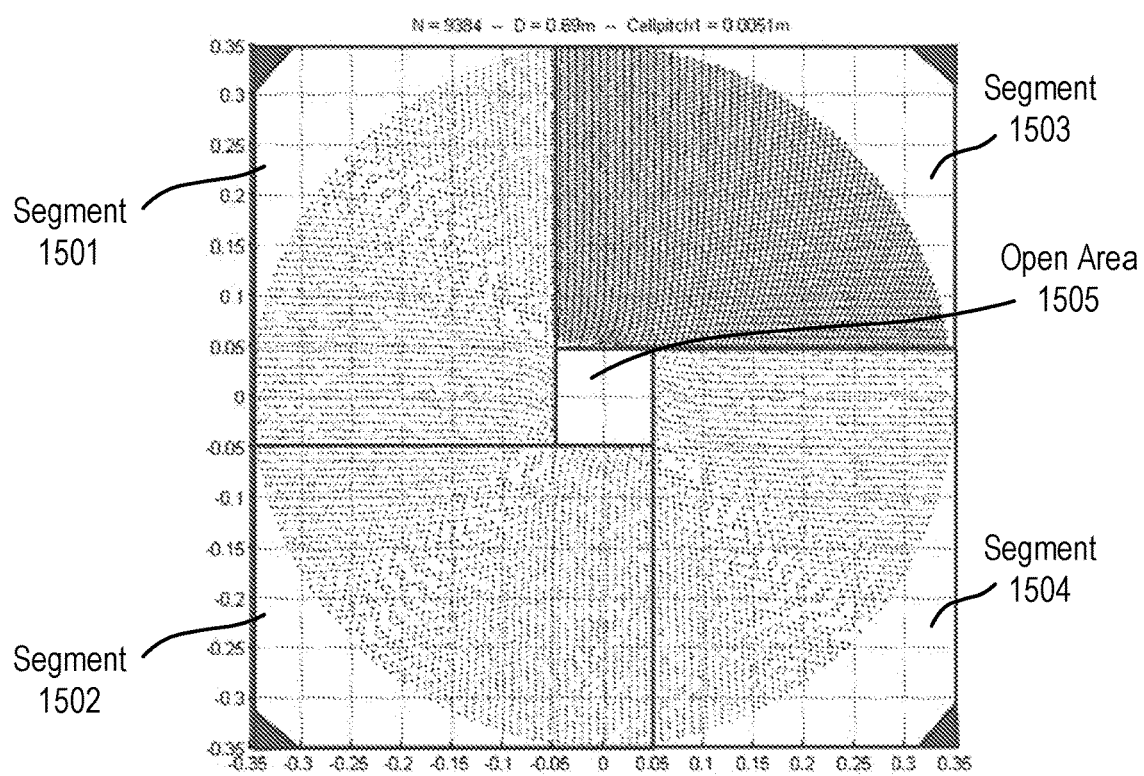
FIG. 15

METHOD TO ASSEMBLE APERTURE SEGMENTS OF A CYLINDRICAL FEED ANTENNA

PRIORITY

The present patent application claims priority to and incorporates by reference the corresponding provisional patent application Ser. No. 62/334,231, titled, "METHOD TO ASSEMBLE APERTURE SEGMENTS OF A CYLINDRICAL FEED ANTENNA," filed on May 10, 2016.

FIELD

Embodiments of the invention relate to antennas for wireless communication; more particularly, embodiments of the invention relate to assembly of aperture segments to generate a-cylindrical feed antenna aperture.

BACKGROUND OF THE INVENTION

Thin-film-transistor (TFT)/liquid crystal (LC) antenna apertures may be formed in a single TFT/LC panel. This requires that the mother glass in the TFT/LC panel fabrication be large enough to accommodate the entire active area, the routing, connection area, seal area, etc. A TFT/LC fabrication facility is a highly tuned line of machinery that operates efficiently at a set throughput, with all equipment in the line matched to this throughput. Therefore, the capital outlay of building such a facility and populating it with equipment is very large.

Unfortunately, TFT/LC aperture fabrication utilizes some processes that are not easily accommodated by existing TFT/LCD fabrication facilities. That is, by performing these steps, the fabrication facility, line, etc. are disrupted, harming the set throughput of the manufacturing line. Therefore, making an antenna aperture with a single TFT/LC panel is inefficient, reduces fabrication throughput, and significantly raises the manufacturing costs of the resulting TFT/LC aperture.

Several mitigations to improve efficiencies and reduce the cost impact on a TFT/LC manufacturing operation are possible. One such mitigation would be to add to the manufacturing line facilities and equipment that can provide manufacturing capacity in the processing steps required by the TFT/LC aperture, so that the throughput of TFT/LC apertures in these steps could match that of the rest of the facility. For a recent generation TFT/LC facility, with a mother glass capable of making the TFT/LC RF aperture in one piece, this capital outlay would be prohibitively large.

A less capital intensive alternative is to produce the TFT/LC RF apertures on older generation, underutilized, and mostly deprecated TFT/LC fabrication equipment. Due to underutilization and the depreciated nature of such fabrication facilities, the impact of unbalancing the line is not as expensive as in a more recent generation fabrication facility. Additionally, building capacity in the required steps is not as capital intensive due to the smaller sizes of the mother glass. Also, some capacity in the manufacturing operations may be obtained from the outside suppliers. However, the mother glass sizes of these older generation fabrication facilities are not large enough to build the TFT/LC RF apertures on one mother glass.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

FIGS. 14A and 14B illustrate a single segment of FIG. 13 with an applied matrix drive lattice;

FIG. 15 illustrates another embodiment of segmentation of a cylindrical feed aperture into quadrants;

DETAILED DESCRIPTION

Figure 1A:
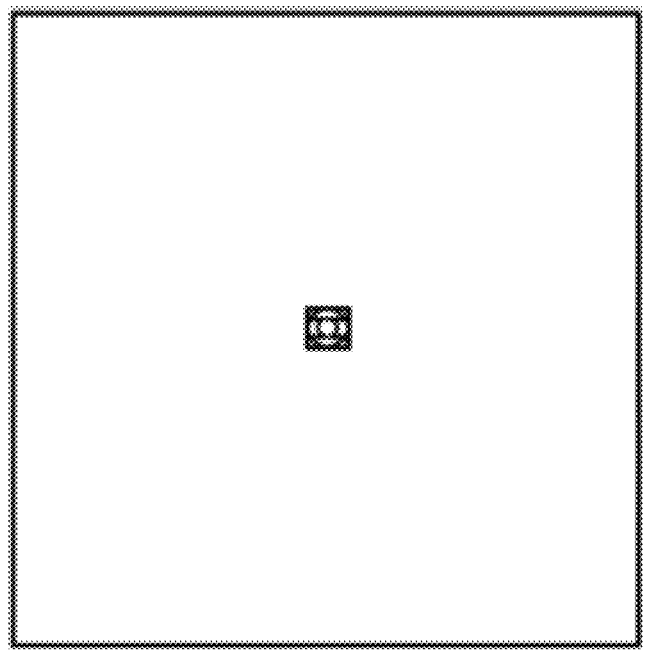
FIG. 1A illustrates a top view of one embodiment of a coaxial feed.

Embodiments of flat panel antennas are disclosed. The flat panel antennas include one or more arrays of antenna elements on an antenna aperture. In one embodiment, the antenna elements comprise liquid crystal cells. In other embodiments, the antenna elements may comprise alternative microelectromechanical structures capable of performing the functions discussed herein. In one embodiment, the flat panel antenna is a cylindrically fed antenna that includes matrix drive circuitry to uniquely address and drive each of the antenna elements that are not placed in rows and columns. In one embodiment, the elements are placed in rings.

In one embodiment, the antenna aperture having the one or more arrays of antenna elements is comprised of multiple segments coupled together. In embodiments, an overlap/underlap method is used to couple segments together to increase a strength of the seams connecting the segments together. When coupled together, the combination of the segments form closed concentric rings of antenna elements. In one embodiment, the concentric rings are concentric with respect to the antenna feed.

In embodiments, the segments discussed in greater detail below, may be produced in fabrication facilities that are not capable of producing an antenna aperture on a single TFT/LC panel. That is older manufacturing and fabrication facilities may be leveraged for a more cost effective way of producing segments, which are then assembled into a cylindrical feed antenna aperture, as discussed in greater detail below. Even for larger, newer generation lines capable of producing apertures without segmentation, however, it may be more economically feasible to use segments that are then assembled to make TFT apertures, then to produce a single aperture from a larger mother glass. For example, a number of segments may be tiled onto a mother glass, such that the number of segments will be greater than the equivalent number of segments in full sized apertures one could tile on the single piece of mother glass. This relationship may be especially true for larger antennas where the costs of better utilization of mother glass using segmentation outweighs the costs associated with assembling apertures from the segments, even when a fabrication facility and/or mother glass is large enough to produce apertures without segmentation.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Overview of an Example of the Antenna System

In one embodiment, the flat panel antenna is part of a metamaterial antenna system. Embodiments of a metamaterial antenna system for communications satellite earth stations are described. In one embodiment, the antenna system is a component or subsystem of a satellite earth station (ES) operating on a mobile platform (e.g., aeronautical, maritime, land, etc.) that operates using either Ka-band frequencies or Ku-band frequencies for civil commercial satellite communications. Note that embodiments of the antenna system also can be used in earth stations that are not on mobile platforms (e.g., fixed or transportable earth stations).

In one embodiment, the antenna system uses surface scattering metamaterial technology to form and steer transmit and receive beams through separate antennas. In one embodiment, the antenna systems are analog systems, in contrast to antenna systems that employ digital signal processing to electrically form and steer beams (such as phased array antennas).

In one embodiment, the antenna system is comprised of three functional subsystems: (1) a wave guiding structure consisting of a cylindrical wave feed architecture; (2) an array of wave scattering metamaterial unit cells that are part of antenna elements; and (3) a control structure to command formation of an adjustable radiation field (beam) from the metamaterial scattering elements using holographic principles.

Examples of Wave Guiding Structures

FIG. 1A illustrates a top view of one embodiment of a coaxial feed that is used to provide a cylindrical wave feed. Referring to FIG. 1A, the coaxial feed includes a center conductor and an outer conductor. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

Figure 1B:
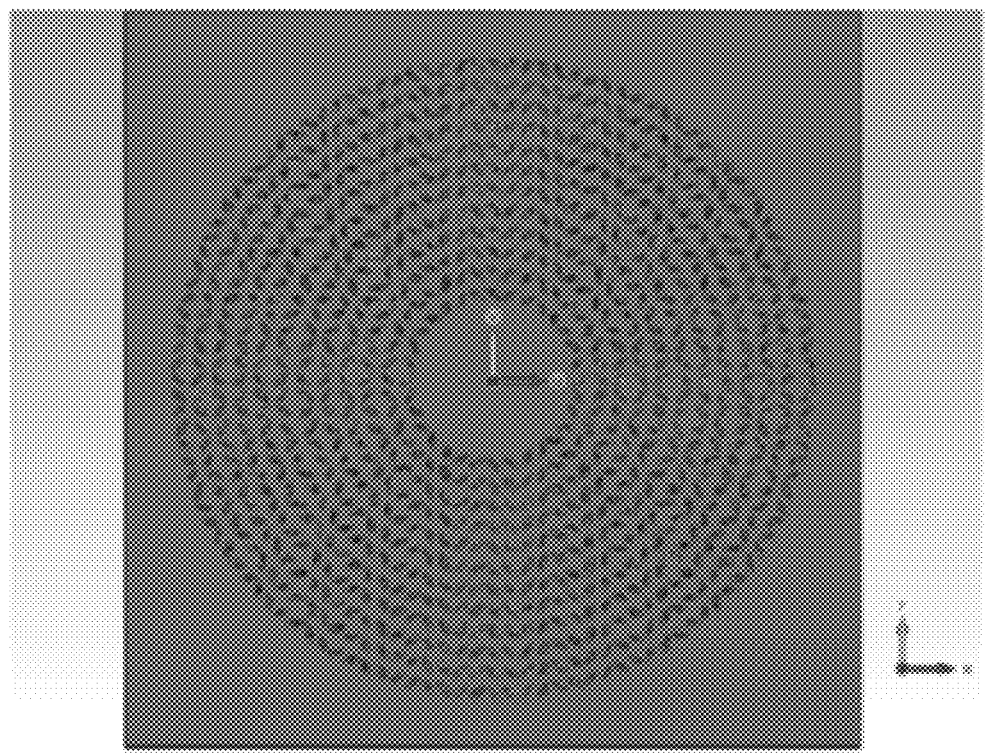
FIG. 1B illustrates an aperture having one or more arrays of antenna elements placed in concentric rings around an input feed of a cylindrically fed antenna.

FIG. 1B illustrates an aperture having one or more arrays of antenna elements placed in concentric rings around an input feed of the cylindrically fed antenna.

Antenna Elements

In one embodiment, the antenna elements comprise a group of patch and slot antennas (unit cells). This group of unit cells comprises an array of scattering metamaterial elements. In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor. As would be understood by those skilled in the art, LC in the context of CELC refers to inductance-capacitance, as opposed to liquid crystal.

In one embodiment, a liquid crystal (LC) is disposed in the gap around the scattering element. Liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, in one embodiment, the liquid crystal integrates an on/off switch and intermediate states between on and off for the transmission of energy from the guided wave to the CELC. When switched on, the CELC emits an electromagnetic wave like an electrically small dipole antenna. Note that the teachings herein are not limited to having a liquid crystal that operates in a binary fashion with respect to energy transmission.

In one embodiment, the feed geometry of this antenna system allows the antenna elements to be positioned at forty five degree (45°) angles to the vector of the wave in the wave feed. Note that other positions may be used (e.g., at 40° angles). This position of the elements enables control of the free space wave received by or transmitted/radiated from the elements. In one embodiment, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides as described above.

The amount of radiated power from each unit cell is controlled by applying a voltage to the patch (potential across the LC channel) using a controller. Traces to each patch are used to provide the voltage to the patch antenna. The voltage is used to tune or detune the capacitance and thus the resonance frequency of individual elements to effectuate beam forming. The voltage required is dependent on the liquid crystal mixture being used. The voltage tuning characteristic of liquid crystal mixtures is mainly described by a threshold voltage at which the liquid crystal starts to be affected by the voltage and the saturation voltage, above which an increase of the voltage does not cause major tuning in liquid crystal. These two characteristic parameters can change for different liquid crystal mixtures.

In one embodiment, a matrix drive is used to apply voltage to the patches in order to drive each cell separately from all the other cells without having a separate connection for each cell (direct drive). Because of the high density of elements, the matrix drive is the most efficient way to address each cell individually.

In one embodiment, the control structure for the antenna system has 2 main components: the controller, which includes drive electronics for the antenna system, is below the wave scattering structure, while the matrix drive switching array is interspersed throughout the radiating RF array in such a way as to not interfere with the radiation. In one embodiment, the drive electronics for the antenna system comprise commercial off-the-shelf LCD controls used in commercial television appliances that adjust the bias voltage for each scattering element by adjusting the amplitude of an AC bias signal to that element.

In one embodiment, the controller also contains a microprocessor executing software. The control structure may also incorporate sensors (e.g., a GPS receiver, a three axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the controller controls which elements are turned off and which elements are turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In one embodiment, multistate control is used in which various elements are turned on and off to varying levels, further approximating a sinusoidal control pattern, as opposed to a square wave (i.e., a sinusoid gray shade modulation pattern). In one embodiment, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others.

The generation of a focused beam by the metamaterial array of elements can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In one embodiment, the antenna system produces one steerable beam for the uplink antenna and one steerable beam for the downlink antenna. In one embodiment, the antenna system uses metamaterial technology to receive beams and to decode signals from the satellite and to form transmit beams that are directed toward the satellite. In one embodiment, the antenna systems are analog systems, in contrast to antenna systems that employ digital signal processing to electrically form and steer beams (such as phased array antennas). In one embodiment, the antenna system is considered a "surface" antenna that is planar and relatively low profile, especially when compared to conventional satellite dish receivers.

Figure 2:
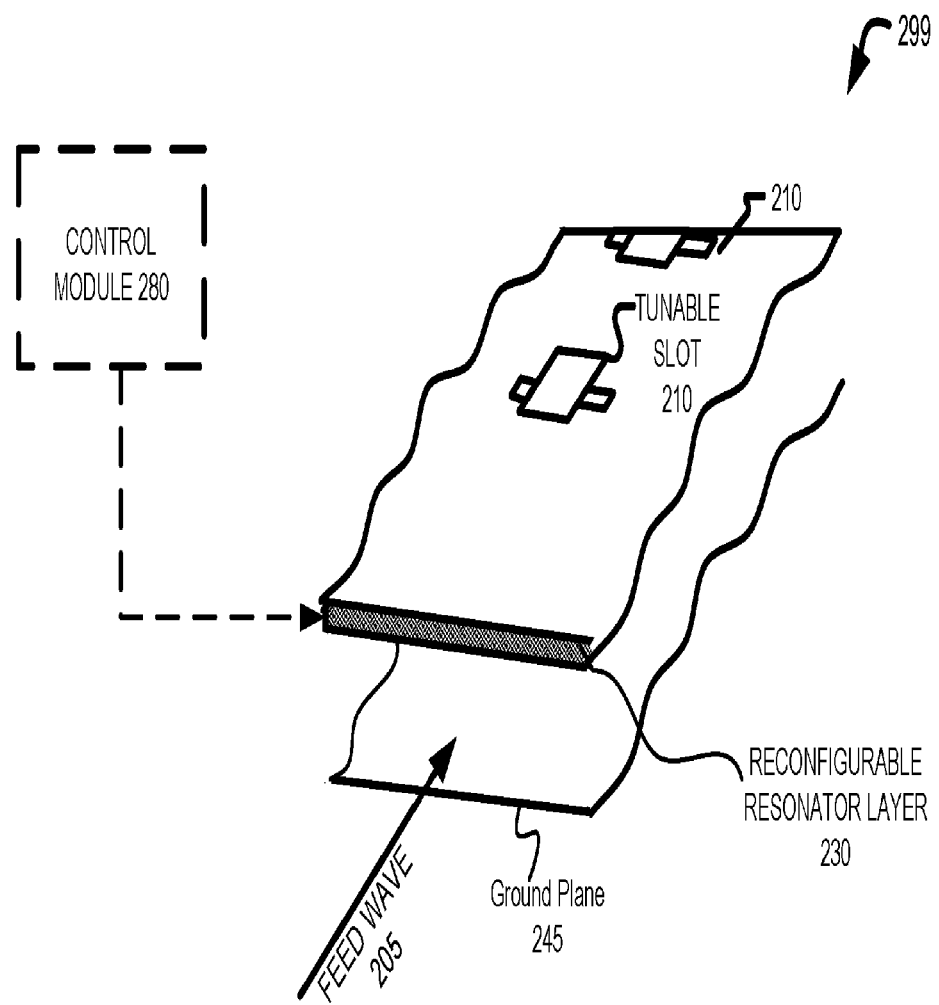
FIG. 2 illustrates a perspective view of one row of antenna elements that includes a ground plane and a reconfigurable resonator layer.

FIG. 2 illustrates a perspective view of one row of antenna elements that includes a ground plane and a reconfigurable resonator layer. Reconfigurable resonator layer 230 includes an array of tunable slots 210. The array of tunable slots 210 can be configured to point the antenna in a desired direction. Each of the tunable slots can be tuned/adjusted by varying a voltage across the liquid crystal.

Control module 280 is coupled to reconfigurable resonator layer 230 to modulate the array of tunable slots 210 by varying the voltage across the liquid crystal in FIG. 2. Control module 280 may include a Field Programmable Gate Array ("FPGA"), a microprocessor, a controller, System-on-a-Chip (SoC), or other processing logic. In one embodiment, control module 280 includes logic circuitry (e.g., multiplexer) to drive the array of tunable slots 210. In one embodiment, control module 280 receives data that includes specifications for a holographic diffraction pattern to be driven onto the array of tunable slots 210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 280 may drive each array of tunable slots described in the figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 205 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable slots 210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram} = w_{in} * w_{out}$, with $w_{in}$ as the wave equation in the waveguide and $w_{out}$ the wave equation on the outgoing wave.

Figure 3:
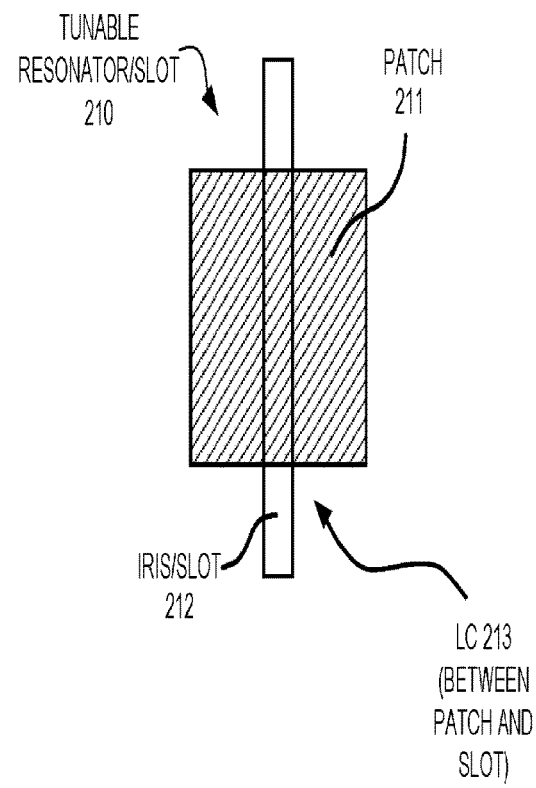
FIG. 3 illustrates one embodiment of a tunable resonator/slot.

FIG. 3 illustrates one embodiment of a tunable resonator/slot 210. Tunable slot 210 includes an iris/slot 212, a radiating patch 211, and liquid crystal 213 disposed between iris 212 and patch 211. In one embodiment, radiating patch 211 is co-located with iris 212.

Figure 4:
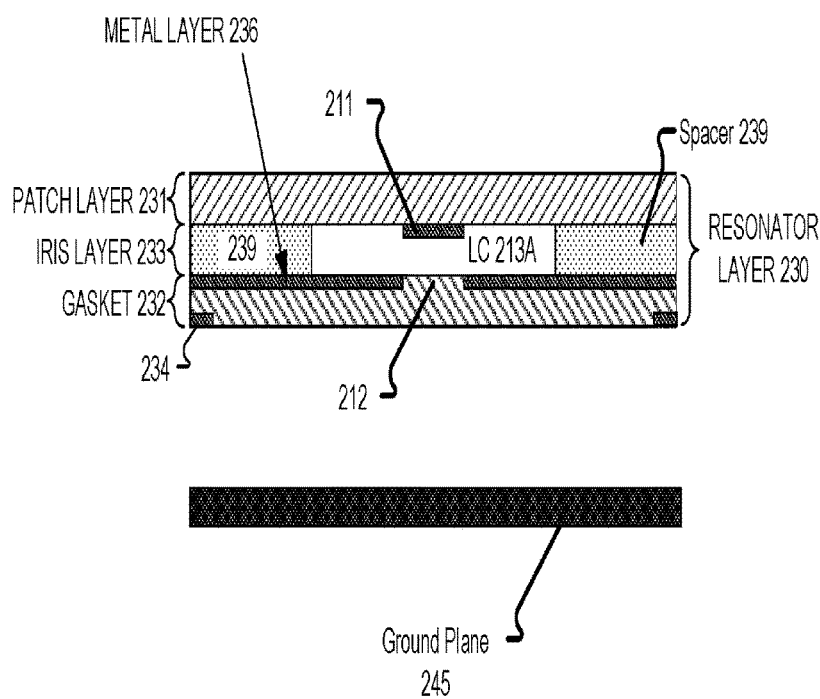
FIG. 4 illustrates a cross section view of an embodiment of a physical antenna aperture.

FIG. 4 illustrates a cross section view of an embodiment of a physical antenna aperture. The antenna aperture includes ground plane 245, and a metal layer 236 within iris layer 233, which is included in reconfigurable resonator layer 230. In one embodiment, the antenna aperture of FIG. 4 includes a plurality of tunable resonator/slots 210 of FIG. 3. Iris/slot 212 is defined by openings in metal layer 236. A feed wave, such as feed wave 205 of FIG. 2, may have a microwave frequency compatible with satellite communication channels. The feed wave propagates between ground plane 245 and resonator layer 230.

Reconfigurable resonator layer 230 also includes gasket layer 232 and patch layer 231. Gasket layer 232 is disposed between patch layer 231 and iris layer 233. Note that in one embodiment, a spacer could replace gasket layer 232. In one embodiment, Iris layer 233 is a printed circuit board ("PCB") that includes a copper layer as metal layer 236. In one embodiment, iris layer 233 is glass. Iris layer 233 may be other types of substrates.

Openings may be etched in the copper layer to form slots 212. In one embodiment, iris layer 233 is conductively coupled by a conductive bonding layer to another structure (e.g., a waveguide) in FIG. 4. Note that in an embodiment the iris layer is not conductively coupled by a conductive bonding layer and is instead interfaced with a non-conducting bonding layer.

Patch layer 231 may also be a PCB that includes metal as radiating patches 211. In one embodiment, gasket layer 232 includes spacers 239 that provide a mechanical standoff to define the dimension between metal layer 236 and patch 211. In one embodiment, the spacers are 75 microns, but other sizes may be used (e.g., 3-200 mm). As mentioned above, in one embodiment, the antenna aperture of FIG. 4 includes multiple tunable resonator/slots, such as tunable resonator/slot 210 includes patch 211, liquid crystal 213, and iris 212 of FIG. 3. The chamber for liquid crystal 213 is defined by spacers 239, iris layer 233 and metal layer 236. When the chamber is filled with liquid crystal, patch layer 231 can be laminated onto spacers 239 to seal liquid crystal within resonator layer 230.

A voltage between patch layer 231 and iris layer 233 can be modulated to tune the liquid crystal in the gap between the patch and the slots (e.g., tunable resonator/slot 210). Adjusting the voltage across liquid crystal 213 varies the capacitance of a slot (e.g., tunable resonator/slot 210). Accordingly, the reactance of a slot (e.g., tunable resonator/slot 210) can be varied by changing the capacitance. Resonant frequency of slot 210 also changes according to the equation $$f = \frac{1}{2\pi\sqrt{LC}}$$

where f is the resonant frequency of slot 210 and L and C are the inductance and capacitance of slot 210, respectively. The resonant frequency of slot 210 affects the energy radiated from feed wave 205 propagating through the waveguide. As an example, if feed wave 205 is 20 GHz, the resonant frequency of a slot 210 may be adjusted (by varying the capacitance) to 17 GHz so that the slot 210 couples substantially no energy from feed wave 205. Or, the resonant frequency of a slot 210 may be adjusted to 20 GHz so that the slot 210 couples energy from feed wave 205 and radiates that energy into free space. Although the examples given are binary (fully radiating or not radiating at all), full grey scale control of the reactance, and therefore the resonant frequency of slot 210 is possible with voltage variance over a multi-valued range. Hence, the energy radiated from each slot 210 can be finely controlled so that detailed holographic diffraction patterns can be formed by the array of tunable slots.

In one embodiment, tunable slots in a row are spaced from each other by λ/5. Other spacings may be used. In one embodiment, each tunable slot in a row is spaced from the closest tunable slot in an adjacent row by λ/2, and, thus, commonly oriented tunable slots in different rows are spaced by λ/4, though other spacings are possible (e.g., λ/5, λ/6.3). In another embodiment, each tunable slot in a row is spaced from the closest tunable slot in an adjacent row by λ/3.

Embodiments of this invention use reconfigurable metamaterial technology, such as described in U.S. patent application Ser. No. 14/550,178, entitled "Dynamic Polarization and Coupling Control from a Steerable Cylindrically Fed Holographic Antenna", filed Nov. 21, 2014 and U.S. patent application Ser. No. 14/610,502, entitled "Ridged Waveguide Feed Structures for Reconfigurable Antenna", filed Jan. 30, 2015, to the multi-aperture needs of the marketplace.

Figures 5A, 5B, 5C, 5D:
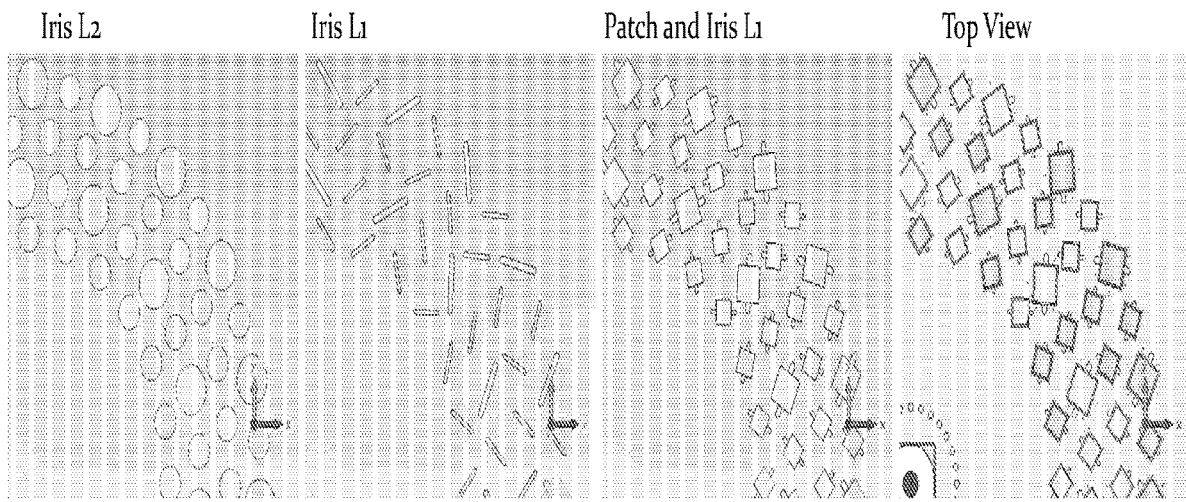
FIGS. 5A-D illustrate one embodiment of the different layers for creating the slotted array.

FIGS. 5A-D illustrate one embodiment of the different layers for creating the slotted array. Note that in this example the antenna array has two different types of antenna elements that are used for two different types of frequency bands. FIG. 5A illustrates a portion of the first iris board layer with locations corresponding to the slots. Referring to FIG. 5A, the circles are open areas/slots in the metallization in the bottom side of the iris substrate, and are for controlling the coupling of elements to the feed (the feed wave). Note that this layer is an optional layer and is not used in all designs. FIG. 5B illustrates a portion of the second iris board layer containing slots. FIG. 5C illustrates patches over a portion of the second iris board layer. FIG. 5D illustrates a top view of a portion of the slotted array.

Figure 6:
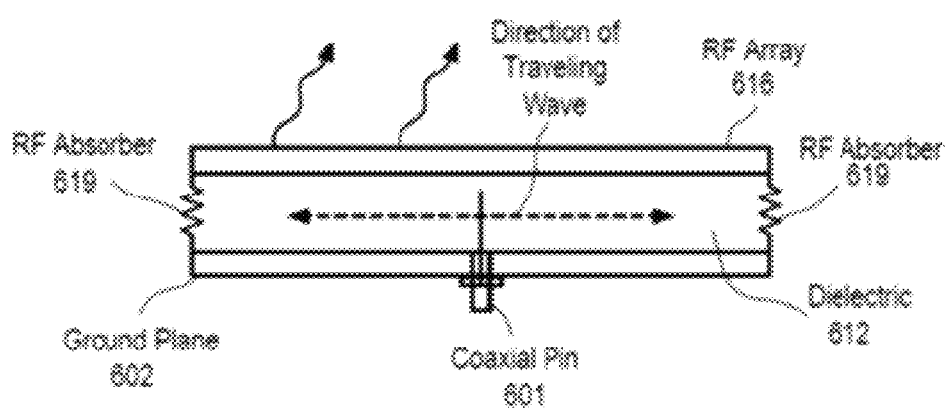
FIG. 6 illustrates another embodiment of the antenna system with a cylindrical feed producing an outgoing wave.

FIG. 6 illustrates another embodiment of the antenna system with a cylindrical feed producing an outgoing wave. Referring to FIG. 6, a ground plane 602 is substantially parallel to an RF array 616 with a dielectric layer 612 (e.g., a plastic layer, etc.) in between them. RF absorbers 619 (e.g., resistors) couple the ground plane 602 and RF array 616 together. In one embodiment, dielectric layer 612 has a dielectric constant of 2-4. In one embodiment, RF array 616 includes the antenna elements as described in conjunction with FIGS. 2-4. A coaxial pin 601 (e.g., 50Ω) feeds the antenna.

In operation, a feed wave is fed through coaxial pin 601 and travels concentrically outward and interacts with the elements of RF array 616.

In other embodiments, the feed wave is fed from the edge, and interacts the elements of RF array 616. An example of such an edge-fed antenna aperture is discussed in U.S. patent application Ser. No. 14/550,178, entitled "Dynamic Polarization and Coupling Control from a Steerable Cylindrically Fed Holographic Antenna", filed Nov. 21, 2014.

The cylindrical feed in the antenna of FIG. 6 improves the scan angle of the antenna over other prior art antennas. Instead of a scan angle of plus or minus forty five degrees azimuth (±45° Az) and plus or minus twenty five degrees elevation (±25° El), in one embodiment, the antenna system has a scan angle of seventy five degrees (75°) from the bore sight in all directions. As with any beam forming antenna comprised of many individual radiators, the overall antenna gain is dependent on the gain of the constituent elements, which themselves are angle-dependent. When using common radiating elements, the overall antenna gain typically decreases as the beam is pointed further off bore sight. At 75 degrees off bore sight, significant gain degradation of about 6 dB is expected.

Cell Placement

Figure 17:
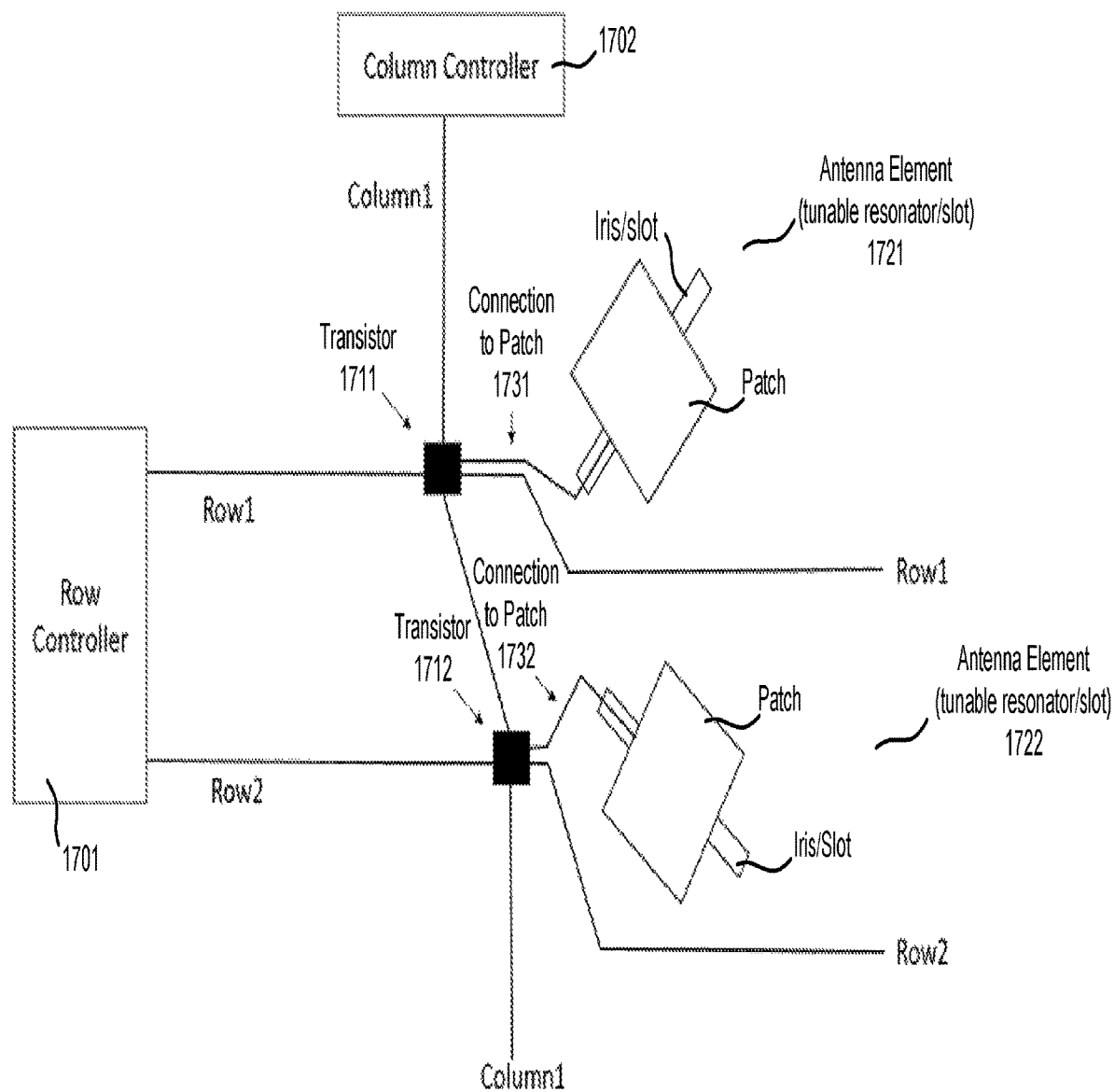
FIG. 17 illustrates one embodiment of the placement of matrix drive circuitry with respect to antenna elements.

In one embodiment, the antenna elements are placed on the cylindrical feed antenna aperture in a way that allows for a systematic matrix drive circuit. The placement of the cells includes placement of the transistors for the matrix drive. FIG. 17 illustrates one embodiment of the placement of matrix drive circuitry with respect to antenna elements. Referring to FIG. 17, row controller 1701 is coupled to transistors 1711 and 1712, via row select signals Row1 and Row2, respectively, and column controller 1702 is coupled to transistors 1711 and 1712 via column select signal Column1. Transistor 1711 is also coupled to antenna element 1721 via connection to patch 1731, while transistor 1712 is coupled to antenna element 1722 via connection to patch 1732.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercial available layout tools.

In one embodiment, the matrix drive circuitry is predefined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 7:
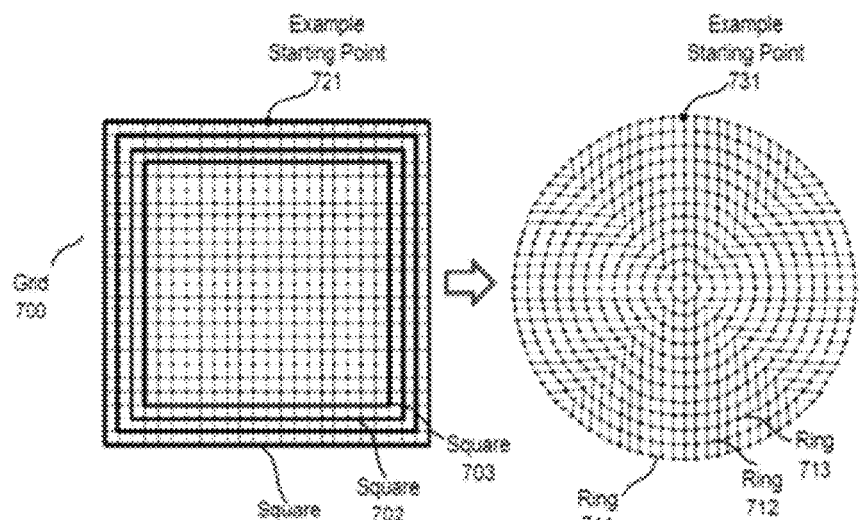
FIG. 7 shows an example where cells are grouped to form concentric squares (rectangles)

FIG. 7 shows an example where cells are grouped to form concentric squares (rectangles). Referring to FIG. 7, squares 701-703 are shown on the grid 700 of rows and columns. Note that these are examples of the squares and not all of the squares to create the cell placement on the right side of FIG. 7. Each of the squares, such as squares 701-703, are then, through a mathematical conformal mapping process, transformed into rings, such as rings 711-713 of antenna elements. For example, the outer ring 711 is the transformation of the outer square 701 on the left.

The density of the cells after the transformation is determined by the number of cells that the next larger square contains in addition to the previous square. In one embodiment, using squares results in the number of additional antenna elements, ΔN, to be 8 additional cells on the next larger square. In one embodiment, this number is constant for the entire aperture. In one embodiment, the ratio of cellpitch1 (CP1:ring to ring distance) to cellpitch2 (CP2: distance cell to cell along a ring) is given by:

$$\frac{CP1}{CP2} = \frac{\Delta N}{2\pi}$$

Thus, CP2 is a function of CP1 (and vice versa). The cellpitch ratio for the example in FIG. 7 is then $$\frac{CP1}{CP2} = \frac{8}{2\pi} = 1.2732$$

which means that the CP1 is larger than CP2.

In one embodiment, to perform the transformation, a starting point on each square, such as starting point 721 on square 701, is selected and the antenna element associated with that starting point is placed on one position of its corresponding ring, such as starting point 731 on ring 711. For example, the x-axis or y-axis may be used as the starting point. Thereafter, the next element on the square proceeding in one direction (clockwise or counterclockwise) from the starting point is selected and that element placed on the next location on the ring going in the same direction (clockwise or counterclockwise) that was used in the square. This process is repeated until the locations of all the antenna elements have been assigned positions on the ring. This entire square to ring transformation process is repeated for all squares.

Figure 8:
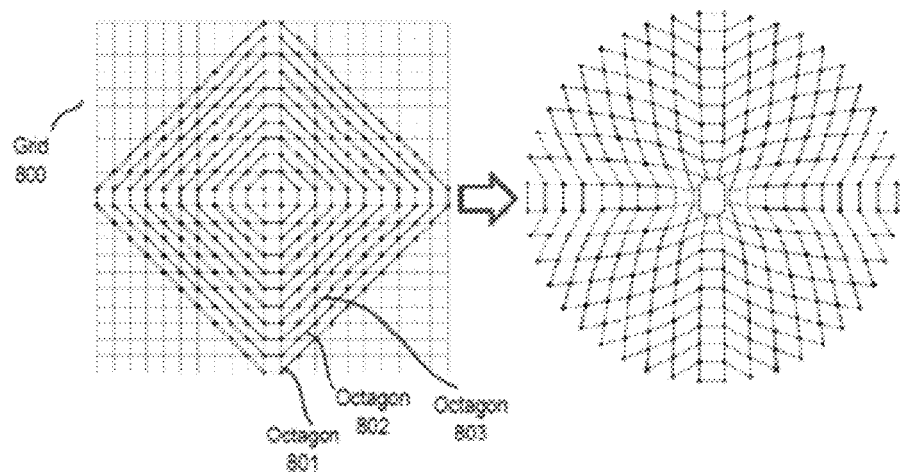
FIG. 8 shows an example where cells are grouped into octagons.

However, according to analytical studies and routing constraints, it is preferred to apply a CP2 larger than CP1. To accomplish this, a second strategy shown in FIG. 8 is used. Referring to FIG. 8, the cells are grouped initially into octagons, such as octagons 801-803, with respect to a grid 800. By grouping the cells into octagons, the number of additional antenna elements ΔN equals 4, which gives a ratio:

$$\frac{CP1}{CP2} = \frac{4}{2\pi} = 0.6366$$

which results in CP2>CP1.

The transformation from octagon to concentric rings for cell placement according to FIG. 8 can be performed in the same manner as that described above with respect to FIG. 7 by initially selecting a starting point.

Note that the cell placements disclosed with respect to FIGS. 7 and 8 have a number of features. These features include:
1) A constant CP1/CP2 over the entire aperture (Note that in one embodiment an antenna that is substantially constant (e.g., being 90% constant) over the aperture will still function);
2) CP2 is a function of CP1;
3) There is a constant increase per ring in the number of antenna elements as the ring distance from the centrally located antenna feed increases;
4) All the cells are connected to rows and columns of the matrix;
5) All the cells have unique addresses;
6) The cells are placed on concentric rings; and
7) There is rotational symmetry in that the four quadrants are identical and a ¼ wedge can be rotated to build out the array. This is beneficial for segmentation.

Note that while two shapes are given, other shapes may be used. Other increments are possible (e.g., 6 increments).

Figure 9:
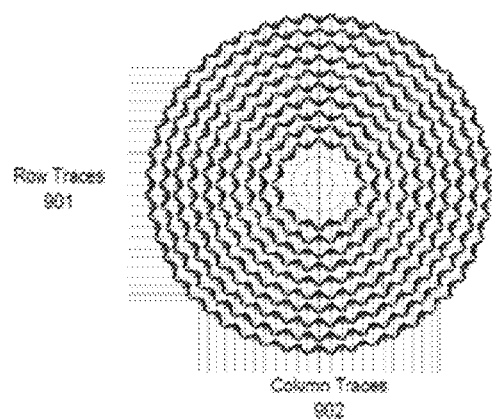
FIG. 9 shows an example of a small aperture including the irises and the matrix drive circuitry.

FIG. 9 shows an example of a small aperture including the irises and the matrix drive circuitry. The row traces 901 and column traces 902 represent row connections and column connections, respectively. These lines describe the matrix drive network and not the physical traces (as physical traces may have to be routed around antenna elements, or parts thereof). The square next to each pair of irises is a transistor.

FIG. 9 also shows the potential of the cell placement technique for using dual-transistors where each component drives two cells in a PCB array. In this case, one discrete device package contains two transistors, and each transistor drives one cell.

Figure 18:
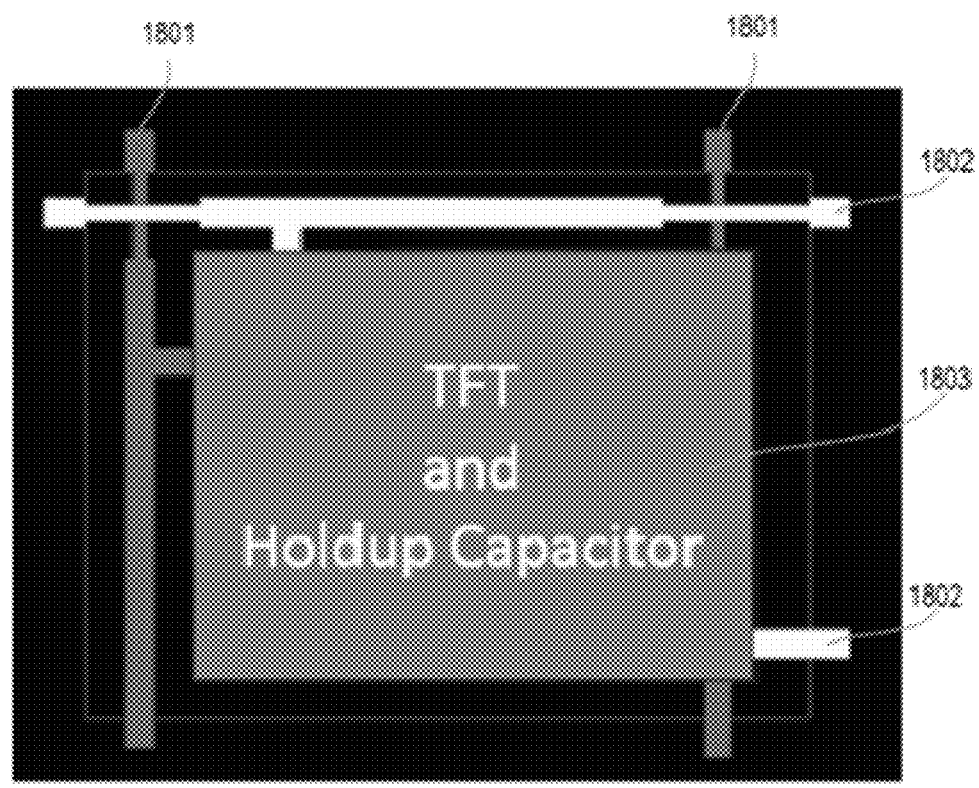
FIG. 18 illustrates one embodiment of a TFT package.

In one embodiment, a TFT package is used to enable placement and unique addressing in the matrix drive. FIG. 18 illustrates one embodiment of a TFT package. Referring to FIG. 18, a TFT and a hold capacitor 1803 is shown with input and output ports. There are two input ports connected to traces 1801 and two output ports connected to traces 1802 to connect the TFTs together using the rows and columns. In one embodiment, the row and column traces cross in 90° angles to reduce, and potentially minimize, the coupling between the row and column traces. In one embodiment, the row and column traces are on different layers.

Another important feature of the proposed cell placement shown in FIGS. 7-9 is that the layout is a repeating pattern in which each quarter of the layout is the same as the others. This allows the sub-section of the array to be repeated rotation-wise around the location of the central antenna feed, which in turn allows a segmentation of the aperture into sub-apertures. This helps in fabricating the antenna aperture by enabling the whole antenna aperture to be assembled from the sub-apertures, as discussed in greater detail below.

In another embodiment, the matrix drive circuitry and cell placement on the cylindrical feed antenna is accomplished in a different manner. To realize matrix drive circuitry on the cylindrical feed antenna, a layout is realized by repeating a subsection of the array rotation-wise. This embodiment also allows the cell density that can be used for illumination tapering to be varied to improve the RF performance.

Figure 10:
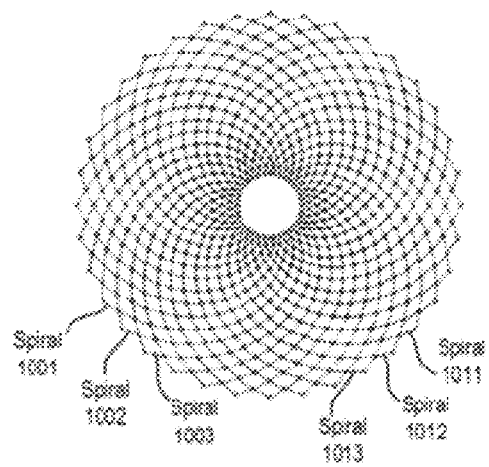
FIG. 10 shows an example of lattice clockwise spirals.

In this alternative approach, the placement of cells and transistors on a cylindrical feed antenna aperture is based on a lattice formed by spiral shaped traces. FIG. 10 shows an example of such lattice clockwise spirals, such as spirals 1001-1003, which bend in a clockwise direction and the spirals, such as spirals 1011-1013, which bend in a clockwise, or opposite, direction. The different orientation of the spirals results in intersections between the clockwise and counterclockwise spirals. The resulting lattice provides a unique address given by the intersection of a counterclockwise trace and a clockwise trace and can therefore be used as a matrix drive lattice. Furthermore, the intersections can be grouped on concentric rings, which is crucial for the RF performance of the cylindrical feed antenna.

Unlike the approaches for cell placement on the cylindrical feed antenna aperture discussed above, the approach discussed above in relation to FIG. 10 provides a non-uniform distribution of the cells. As shown in FIG. 10, the distance between the cells increases with the increase in radius of the concentric rings. In one embodiment, the varying density is used as a method to incorporate an illumination tapering under control of the controller for the antenna array.

Figure 11:
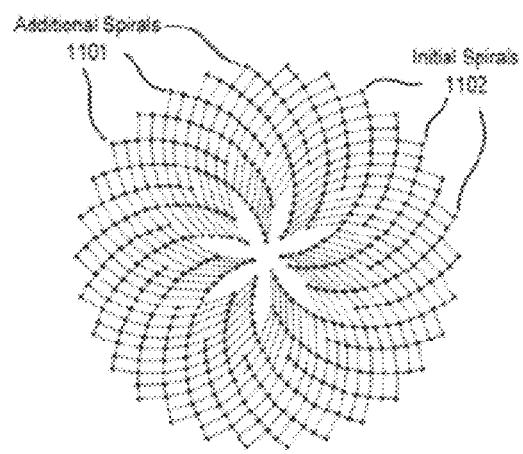
FIG. 11 shows another example of cell placement that uses additional spirals.

Due to the size of the cells and the required space between them for traces, the cell density cannot exceed a certain number. In one embodiment, the distance is $\lambda/5$ based on the frequency of operation. As described above, other distances may be used. In order to avoid an overpopulated density close to the center, or in other words to avoid an underpopulation close to the edge, additional spirals can be added to the initial spirals as the radius of the successive concentric rings increases. FIG. 11 shows an example of cell placement that uses additional spirals to achieve a more uniform density. Referring to FIG. 11, additional spirals, such as additional spirals 1101, are added to the initial spirals, such as spirals 1102, as the radius of the successive concentric rings increases. According to analytical simulations, this approach provides an RF performance that converges the performance of an entirely uniform distribution of cells. Note that this design provides a better sidelobe behavior because of the tapered element density than some embodiments described above.

Figure 12:
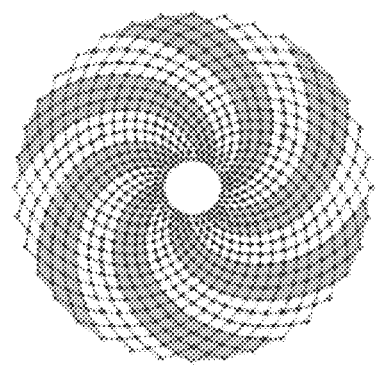
FIG. 12 illustrates a selected pattern of spirals that is repeated to fill the entire aperture.

Another advantage of the use of spirals for cell placement is the rotational symmetry and the repeatable pattern which can simplify the routing efforts and reducing fabrication costs. FIG. 12 illustrates a selected pattern of spirals that is repeated to fill the entire aperture.

Note that the cell placements disclosed with respect to FIGS. 10-12 have a number of features. These features include:
1) CP1/CP2 is not over the entire aperture;
2) CP2 is a function of CP1;
3) There is no increase per ring in the number of antenna elements as the ring distance from the centrally located antenna feed increases;
4) All the cells are connected to rows and columns of the matrix;
5) All the cells have unique addresses;
6) The cells are placed on concentric rings; and
7) There is rotational symmetry (as described above).

Thus, the cell placement embodiments described above in conjunction with FIGS. 10-12 have many similar features to the cell placement embodiments described above in conjunction with FIGS. 7-9.

Aperture Segmentation

In one embodiment, a single antenna aperture is created by combining multiple segments of antenna elements (e.g., sub-apertures) together. This requires that the array of antenna elements be segmented and the segmentation ideally requires a repeatable footprint pattern of the antenna. In one embodiment, the segmentation of a cylindrical feed antenna array occurs such that the antenna footprint does not provide a repeatable pattern in a straight and inline fashion due to the different rotation angles of each radiating element. One goal of the segmentation approach discussed herein is to provide segmentation without compromising the radiation performance of the antenna. Another goal of the segmentation approach discussed herein is to maintain mechanical strength along seams by which apertures are joined to ensure planarity and continuity between sub-aperture segments, and to hold registration to a high degree of accuracy between assembled segments. Yet another goal of the segmentation approach discussed herein is to seal the area surrounding the seams to protect the inner workings of aperture segments from environmental exposure and/or damage.

While segmentation techniques described herein focus on improving, and potentially maximizing, the surface utilization of industry standard substrates with rectangular shapes, the segmentation approach is not limited to such substrate shapes.

In one embodiment, segmentation of a cylindrical feed antenna is performed in a way that the combination of four segments realize a pattern in which the antenna elements are placed on concentric and closed rings. This aspect is important to maintain the RF performance of the resulting aperture for the cylindrical feed antenna. Furthermore, by joining the four segments in the manner discussed in greater detail below, planarity and continuity of the antenna elements may be maintained among the joined apertures to maintain RF performance. Furthermore, in one embodiment, each segment requires a separate matrix drive circuitry.

Figure 13:
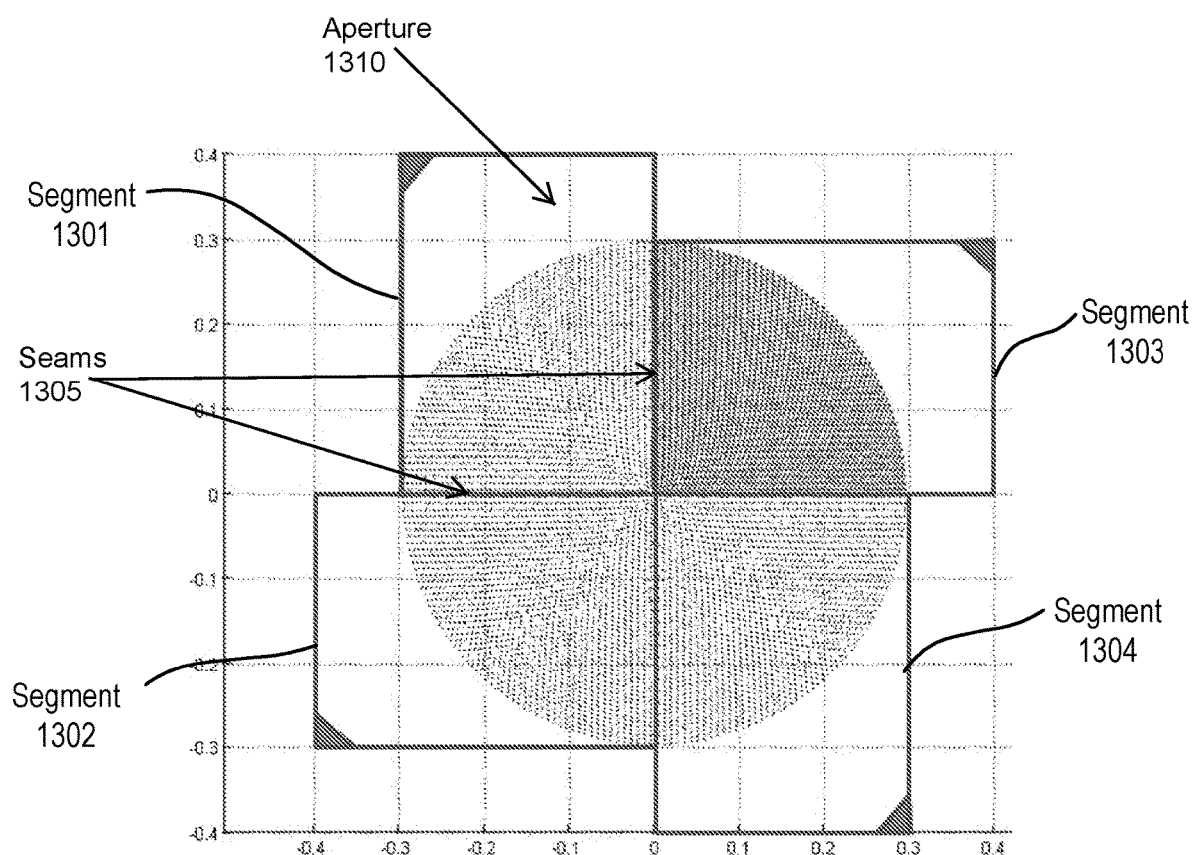
FIG. 13 illustrates an embodiment of segmentation of a cylindrical feed aperture into quadrants.

FIG. 13 illustrates segmentation of a cylindrical feed aperture into quadrants. Referring to FIG. 13, segments 1301-1304 are identical quadrants that are combined to build a round antenna aperture 1310. The antenna elements on each of segments 1301-1304 are placed in portions of rings that form concentric and closed rings when segments 1301-1304 are combined.

In one embodiment, an overlap method is utilized so that each segment (e.g., each of segments 1301-1304) participates in contributing to two seams (e.g., seams 1305) between adjacent segments when combined into the single antenna aperture. One of the potential problems in joining segments 1301-1304 together to form a full aperture is creating a continuous conductive iris plane across the aperture 1310 to prevent RF from leaking from the seams and to help mitigate sidelobes.

Figure 20:
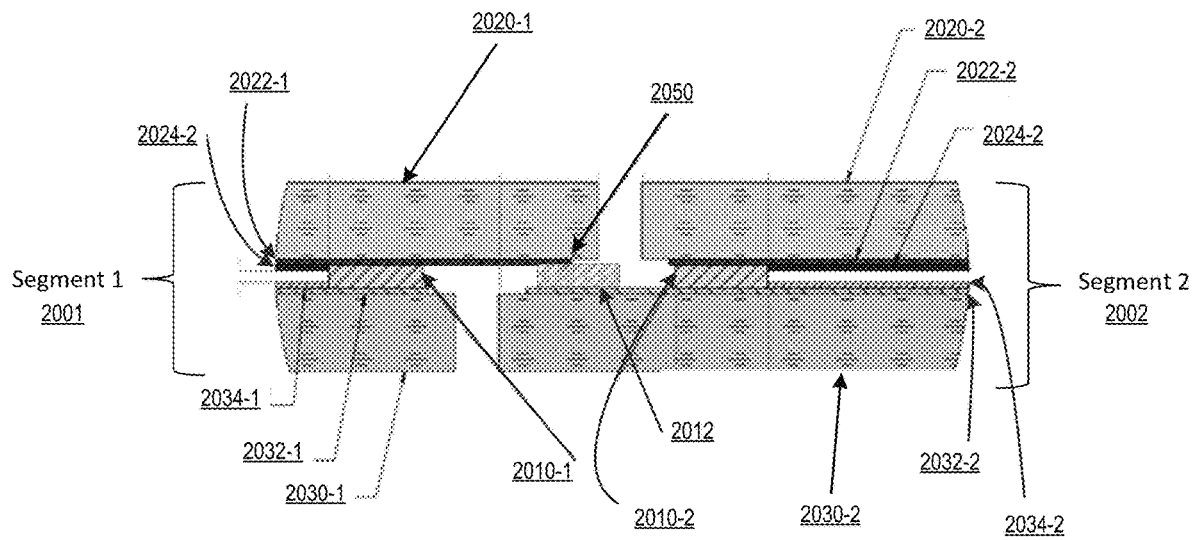
FIG. 20 illustrates one embodiment of coordinated edges of adjacent segments of an antenna aperture.

Therefore, in one embodiment, the overlap method for combining segments 1301-1304 utilizes overlapping patch glass with underlapping iris glass on a first seam of a segment, and underlapping patch glass with overlapping iris glass on a second seam of a segment. FIG. 20 illustrates one embodiment of coordinated edges of adjacent segments of an antenna aperture. When viewing a side of segment 2001 that will contribute to creating a seam with a side of segment 2002, the patch glass 2020-1 of segment 2001 is extended in an overlap region 2050 out past the outside edge of conductive adhesive seal 2010-1, whereas the iris glass 2030-1 of segment 2001 ends just after segment's 2001 conductive adhesive seal 2010-1. The side of segment 2002 is complementary to the side of segment 2001, and patch glass 2020-2 of segment 2002 ends just after conductive adhesive seal 2010-2 of segment 2002, with iris glass 2030-2 of segment 2002 extended out past the outer edge of the conductive adhesive seal 2010-2 of segment 2002. This creates complementary overlapping and underlapping pieces of glass along each edge of the segments to be joined when creating a seam.

In one embodiment, conductive adhesive seals 2010-1 and 2012-2 provide a conductive connection between the layers of segments 2001 and 2002, respectively. To accomplish a conductive connection between an iris and a patch of each segment, such as segment 2001, conductive adhesive seal 2010-1 with the ability to establish an electrical connection between the iris 2030-1 and patch 2020-1 is placed first between the iris metal 2022-1 and patch metal 2032-1, during an assembly of the individual segments. Because each segment is identically constructed (e.g., identical quadrants of an antenna aperture), segment 2002 is similarly and complimentary around the overlap region 2050 (e.g., with conductive adhesive seal 2010-1 forming a conductive connection between patch metal layer 2022-2 and iris metal layer 2033-2). Additionally, during assembly as discussed in greater detail herein, the iris metal layer 2032-1 of segment 2001 is joined with the patch metal layer 2022-2 of segment 2002 by an adhesive seal 2012 that forms a physical connection joining the segments in the overlap region 2050. In one embodiment, the adhesive seal 2012 is a conductive adhesive seal. In embodiments where adhesive seal 2012 is conductive, adhesive seal 2012 can be formed using any of the conductive adhesives well-known to those with ordinary skill in the art of TFT manufacturing, e.g. conductive epoxies, anisotropic conductive adhesives and films, etc. Furthermore, in one embodiment, the conductive nature of the adhesive seal creates a contiguous ground plane between iris metal layers (e.g., iris metal layer 2032-1 and iris metal layer 2032-2) of different segments, and when all segments are joined creates a contiguous ground plane across iris metal layers of all segments. In another embodiment, the adhesive seal is a non-conductive adhesive seal. In one embodiment, when the adhesive is non-conductive, an RF choke is formed at the seam between segment 2001 and segment 2002 that prevents RF leakage at the seam formed when the segments are joined.

In embodiments, passivation layers, such as passivation layer 2024-1 and 2024-2 on patch metal layers 2022-1 and 2022-2, respectively, as well as passivation layer 2034-1 and 2034-2 on iris metal layers 2032-1 and 2032-2, respectively, may provide a light coat of a protective material that protects the patch metal layers and iris metal layers of each segment against corrosion or other environmental factors. In embodiments, when four identical aperture quadrants (e.g., segments 1301-1304) made in the way described above, and are placed edge to edge in an assembly, seam regions are formed where the patch glass metal (e.g., 2022-1) of one edge of a segment (e.g., segment 2001) will overlap the iris glass metal (e.g., 2032-2) of the adjacent segment (e.g., segment 2002) in the overlap region 2050. Similarly, on the other side of the illustrated segments, a complimentary overlapping will occur.

Then, in embodiments, during assembly of segments into a full aperture, adhesive seal 2012 is placed in the overlap region 2050 of the patch and iris between the segments during the assembly of the segments into a full aperture, as discussed below. In embodiments, the adhesive seal 2012 joins segments 2001 and 2002 together, such as by forming a bond. In other embodiments, other techniques for joining segments, such as soldering, brazing, direct contact, etc., may be used.

In one embodiment, as discussed above, adhesive seal 2012 may be conductive, although in other embodiments, adhesive seal 2012 is not conductive. In either embodiment, adhesive seal 2012, which is optionally applied to either of the iris region of segment 2002 or patch region of segment 2001, or both, may be utilized to join segment 2001 with segment 2002 during an assembly process that combines each segment to create antenna aperture 1310, such as each of four segments where each segment is an identical quadrant of a cylindrical feed antenna aperture.

In the embodiment illustrated in FIG. 20, where segments have complementary patch and iris overlaps and underlaps, an improved physical connection is obtained when the segments are joined together forming an overlap region. The improved physical connection has an increased strength to ensure that the segments maintain their position and planarity relative to one another. Furthermore, continuity and registration is maintained between segments with a high degree of accuracy to ensure quality of RF. In the illustrated embodiments, the overlap at the seam regions further protects the metal edges of the segments from the environment.

In embodiments, alternative overlapping arrangements may be used consistent with the discussion herein. For example, different sets of segments, such as a first set with overlaps on each seam region and a second set with underlaps on each seam region, with metal and passivation layers extending in the overlap/underlap regions past segment conductive seals, as discussed herein. Such an arrangement using two different sets of aperture segments has the advantage of being easy to assemble, but has the disadvantage of have two types of segments that may require different assembly processes for each segment type.

As the result of this segmentation method illustrated in FIG. 13, the seams between segments 1301-1304 meet at the center and go radially from the center to the edge of the antenna aperture once the segments 1301-1304 are assembled. This configuration is advantageous since the generated currents of the cylindrical feed propagate radially and a radial seam has a low parasitic impact on the propagated wave.

As shown in FIG. 13, rectangular substrates, which are a standard in the LCD industry, can also be used to realize an aperture. FIGS. 14A and 14B illustrate a single segment of FIG. 13 with the applied matrix drive lattice. The matrix drive lattice assigns a unique address to each of transistor. Referring to FIGS. 14A and 14B, a column connector 1401 and row connector 1402 are coupled to drive lattice lines. FIG. 14B also shows irises coupled to lattice lines.

As is evident from FIG. 13, a large area of the substrate surface cannot be populated if a non-square substrate is used. In order to have a more efficient usage of the available surface on a non-square substrate, in another embodiment, the segments are on rectangular boards but utilize more of the board space for the segmented portion of the antenna array. One example of such an embodiment is shown in FIG. 15. Referring to FIG. 15, the antenna aperture is created by combining segments 1501-1504, which comprises substrates (e.g., boards) with a portion of the antenna array included therein. While each segment does not represent a circle quadrant, the combination of four segments 1501-1504 closes the rings on which the elements are placed. That is, the antenna elements on each of segments 1501-1504 are placed in portions of rings that form concentric and closed rings when segments 1501-1504 are combined. In one embodiment, the substrates are combined and introduce open area 1505. Open area 1505 is where the centrally located antenna feed is located and included in the antenna. Furthermore, each of segments 1501-1504 can utilize the overlap method discussed above with respect to FIG. 20 so that complementary side of the segments 1501-1504, when joined, improve the connection at the seam regions of the antenna aperture.

The antenna feed is coupled to the rest of the segments when the open area exists because the feed comes from the bottom, and the open area can be closed by a piece of metal to prevent radiation from the open area. A termination pin may also be used.

The use of substrates in this fashion allows use of the available surface area more efficiently and results in an increased aperture diameter.

Figures 16A, 16B:
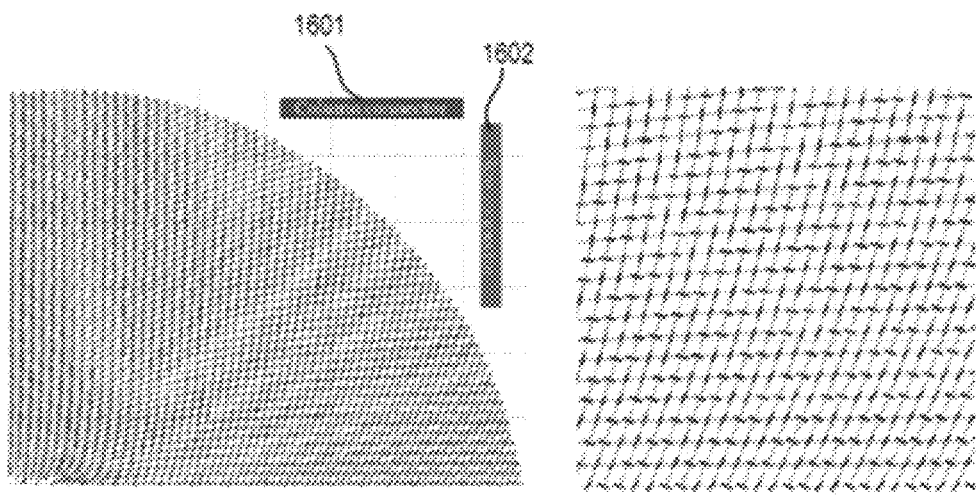
FIGS. 16A and 16B illustrate a single segment of FIG. 15 with an applied matrix drive lattice.

Similar to the embodiment shown in FIGS. 13, 14A and 14B, this embodiment allows use of a cell placement strategy to obtain a matrix drive lattice to cover each cell with a unique address. FIGS. 16A and 16B illustrate a single segment of FIG. 15 with the applied matrix drive lattice. The matrix drive lattice assigns a unique address to each of transistor. Referring to FIGS. 16A and 16B, a column connector 1601 and row connector 1602 are coupled to drive lattice lines. FIG. 16B also shows irises.

For both approaches described above, the cell placement may be performed based on a recently disclosed approach which allows the generation of matrix drive circuitry in a systematic and predefined lattice, as described above.

Figure 19A:
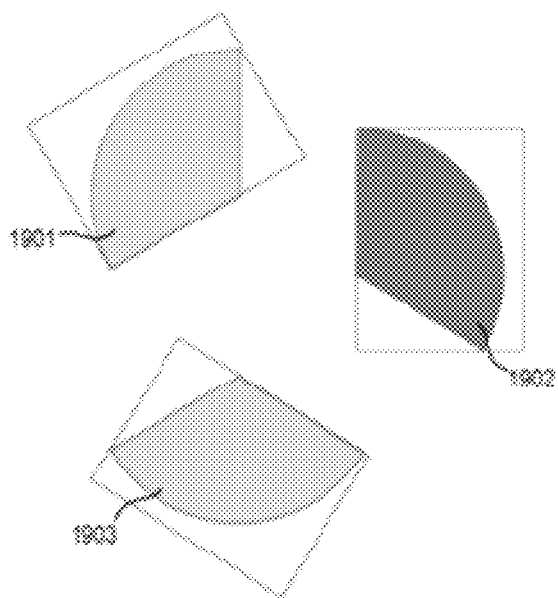
FIGS. 19A and B illustrate one example of an antenna aperture with an odd number of segments.
Figure 19B:
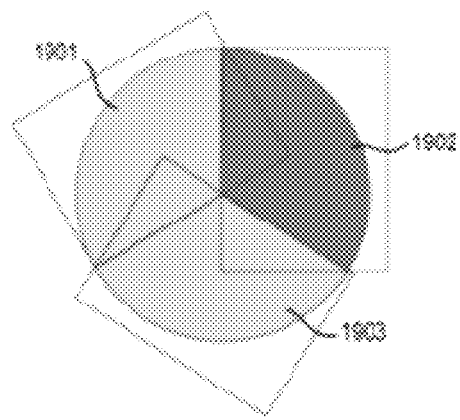

While the segmentations of the antenna arrays above are into four segments, this is not a requirement. The arrays may be divided into an odd number of segments, such as, for example, three segments or five segments. FIGS. 19A and B illustrate one example of an antenna aperture with an odd number of segments. Referring to FIG. 19A, there are three segments, segments 1901-1903, that are not combined. Referring to FIG. 19B, the three segments, segments 1901-1903, when combined, form the antenna aperture. These arrangements are not advantageous because the seams of all the segments do not go all the way through the aperture in a straight line. However, they do mitigate sidelobes.

Assembly of Antenna Aperture Segments

In one embodiment, segments, such as segments 1301-1304 having an overlap/underlap and underlap/overlap on opposite sides corresponding to seam regions of each segment, are joined together to form an antenna aperture (e.g., aperture 1310). To ensure RF performance of the antenna aperture, a high degree of accuracy is required when placing each segment relative to an aperture pattern origin, and also when placing and bonding the different segments to one another along seam regions of the segments. Furthermore, a bond between aperture segments with a high mechanical strength is needed to ensure continuity and planarity between the segments of the resulting antenna aperture.

Figure 21:
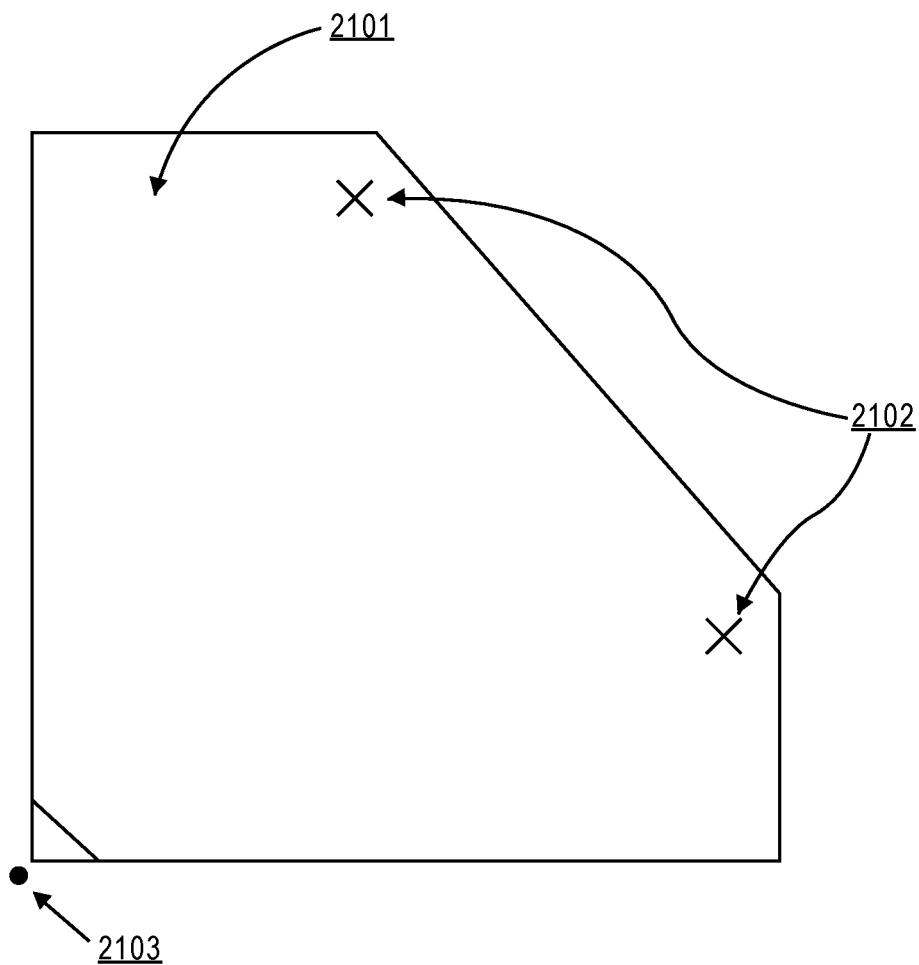
FIG. 21 illustrates one embodiment of a segment with two fiducials thereon.

In one embodiment, during assembly of the segments into an antenna aperture, fiducials are utilized to align segments with RF elements. As discussed herein, a fiducial is an object or marking that serves as a point of reference to an aperture pattern origin. In one embodiment, fiducials are used to align segments with an aperture pattern origin, and with respect to other segments when on an assembly fixture (e.g. a fixed table or other work surface). FIG. 21 illustrates a segment 2101, such as a quadrant of an antenna aperture (e.g., segment 1301), with two fiducials 2102. In one embodiment, segment 2101 is constructed with two fiducials 2102. As discussed herein, since each constructed segment is the same, each segment therefore has two fiducials (e.g., fiducials 2102). In one embodiment, the position of fiducials 2102 may be out of the area of the RF elements of an aperture segment. Furthermore, the fiducials 2102 are placed using the same processes as the RF elements, e.g., during fabrication of the TFT glass. In embodiments, the fiducials 2102 are in a known position with respect to the RF element placements, and with respect to an aperture pattern origin 2103. The aperture pattern origin, in embodiments, need not be located on segment 2101. Although two fiducials 2102 are illustrated, any number of fiducials greater than 2 can also be used consistent with the discussion herein.

Figure 22:
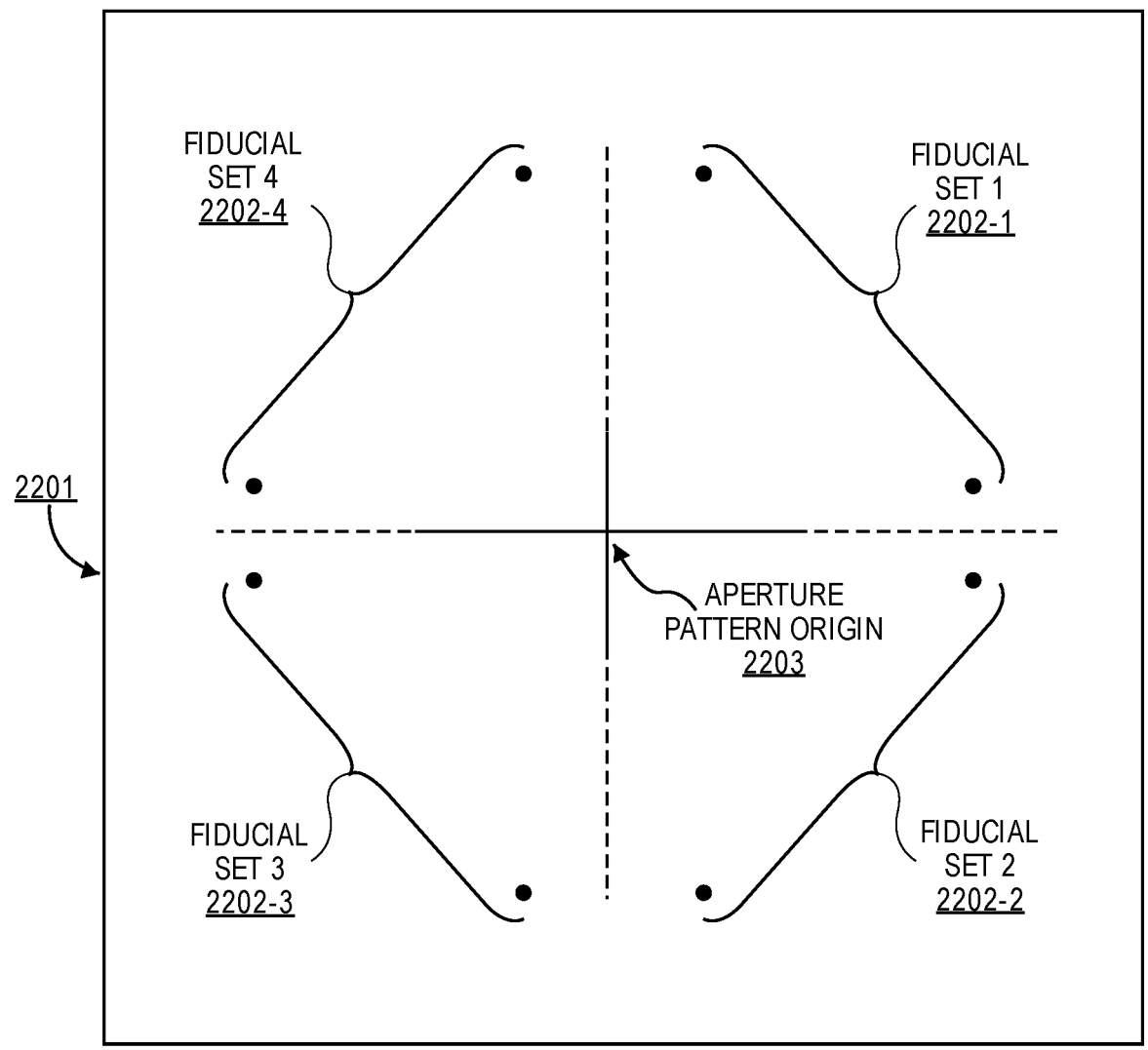
FIG. 22 illustrates one embodiment of a surface of an assembly fixture for assembling aperture segments into a single antenna aperture.

In embodiments, with sets of fiducials relative to a pattern original (e.g., four sets, two fiducials for each segment/quadrant) having known distances and orientations, each segment can be precisely aligned with other segments, and with respect to an ultimate antenna aperture, during an assembly process. In one embodiment, an assembly fixture having a corresponding pattern of fiducials for each aperture segment and an aperture pattern origin is utilized to place and assemble the aperture segments. FIG. 22 illustrates one embodiment of a surface of an assembly fixture 2201 for assembling aperture segments into a single antenna aperture.

In one embodiment, assembly fixture's 2201 surface is large enough to assemble all of the segments (e.g., aperture segments 1301-1304) to create a full antenna aperture. In embodiments, the assembly fixture 2201 contains sets of fiducials (e.g., fiducial sets 2202-1 through 2202-4) corresponding to the fiducials on each segment discussed above in FIG. 21. The sets of fiducials 2202-1 through 2202-4 for each segment, such as two fiducials for each segment, are placed on the fixture 2201 relative to aperture pattern origin 2203. For example, each set of fiducials 2202-1 through 2202-4 are machined or otherwise permanently marked on the surface of assembly fixture 2201 relative to aperture pattern original 2203. By machining the fiducials relative to the pattern origin, the positions may be marked on assembly's 2201 surface with the requisite accuracy for placing, bonding, and assembling aperture segments relative to one another and relative to the pattern origin, as discussed herein. In embodiments, using the fiducial sets, the segments can be aligned relative to the pattern origin in the range of 0.050 inches. Furthermore, once segments are placed relative to one another, a gap range between the segments will be in the range of 0.002 inches. Thus, the placement of the segments relative to one another and relative to the aperture pattern origin may be performed at a high degree of accuracy.

In embodiments, fiducials 2102 may be transparent or semitransparent, or optionally an area of segment 2101 surrounding fiducials 2102 may be transparent or semitransparent, so that fiducials 2101 can be optically aligned, either manually or in an automated manner, with the fiducials of assembly 2201. After all the segments are in position, based on alignment of fiducials relative to the aperture pattern origin, they may be held in position while the segment are adhered to each other, and/or to another object, such as a carrier, RF structure, a grounded metal or non-metal protector, a radome structure, or another structure.

Segment Placement

Figure 23:
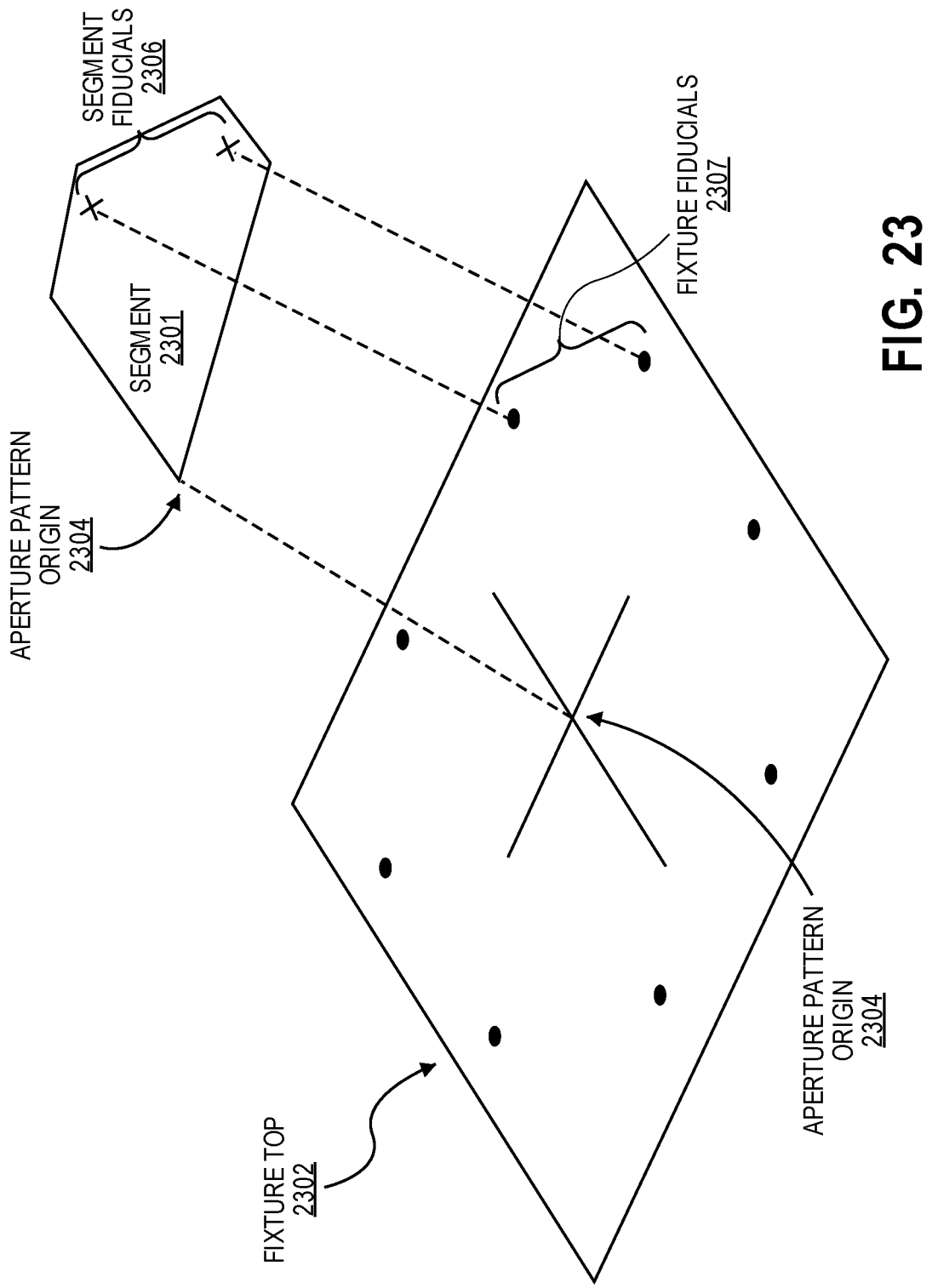
FIG. 23 illustrates one embodiment of placement of an aperture segment on an assembly fixture.

FIG. 23 illustrates one embodiment of placement of an aperture segment 2301 on assembly fixture 2302. In one embodiment, segments (e.g., each of the four aperture quadrants) are placed onto fixture 2302 one at a time, using a user controlled or automated pick and place system (e.g., autonomous robots, user controlled robotic assembly device, user operated carriers, etc.). However, two or more segments may be placed on fixture 2302 simultaneously.

In one embodiment, retractable segment placement pins (not shown) are used to do a rough placement of the segment 2306 on the fixture 2302. After all of the segments have been placed in their rough positions, the segments are moved one at a time to line up the fiducials on the segments to the corresponding fiducials on the fixture, such as aligning segment fiducials 2306 with fixture fiducials 2307. This alignment may be done using magnification, such as from a camera or an eye loop.

Following alignment, a vacuum may be used to hold the segments in alignment while other segments are moved into their respective alignments. In one embodiment, the adhesive seal applied to an overlap region of one or more segment edges is applied prior to alignment, and thus each segment is aligned above a segment with which it will be joined, and lowered onto an adjacent segment when alignment is achieved using fiducials 2306 and 2307. The alignment ensures proper positioning of segment 2301 to aperture pattern origin 2304, and each segment relative to one another.

Figure 24:
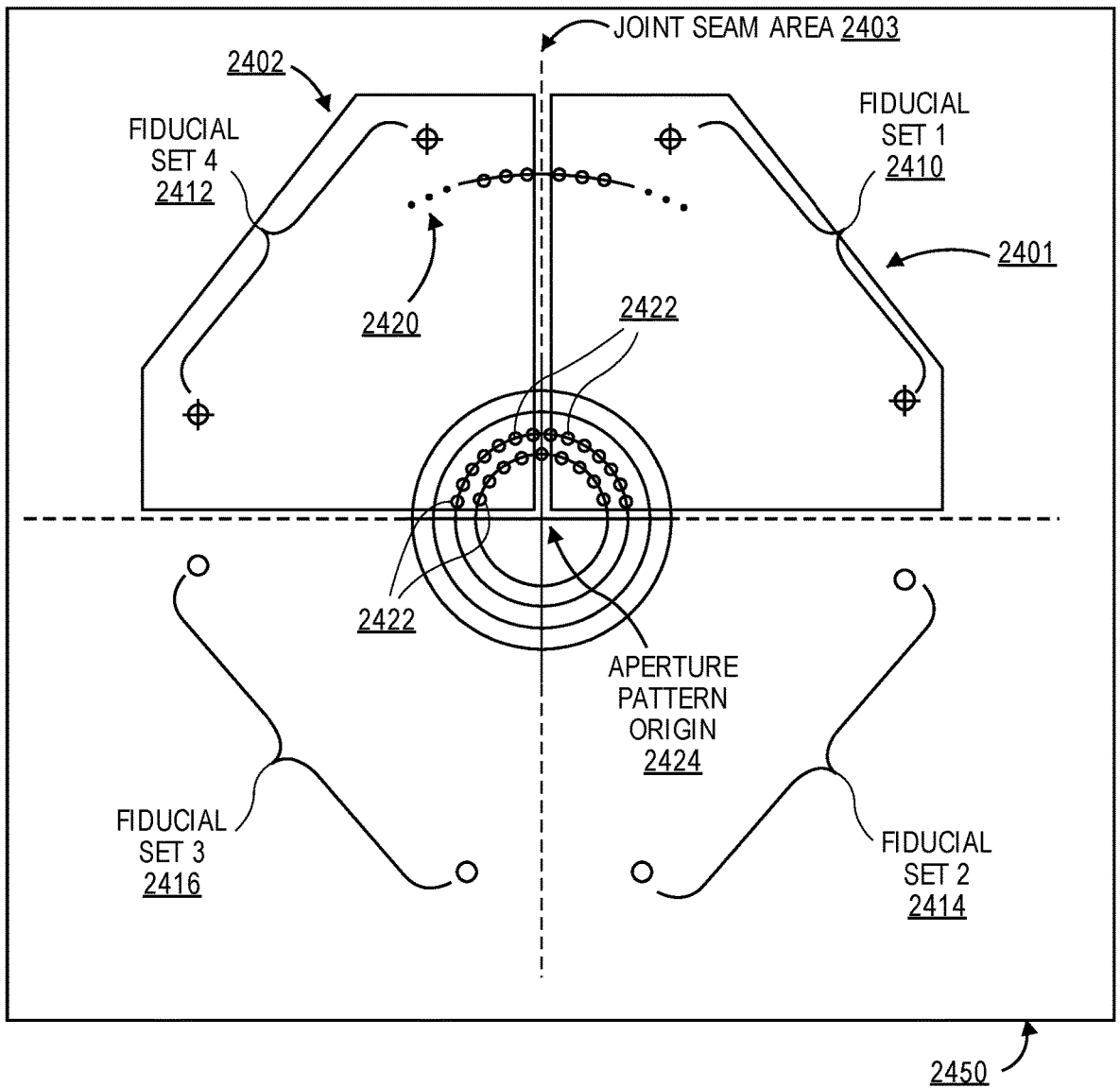
FIG. 24 illustrates one embodiment of a partially assembled antenna aperture.

FIG. 24 illustrates one embodiment of a partially assembled antenna aperture. The partially assembled antenna aperture includes placed segment 2401 aligned using fiducial set 2410 on fixture 2450. Furthermore, segment 2402 has also been aligned using fiducial set 2412 on fixture 2450, and joined at seam region 2403 using the overlap/underlap method discussed above. That is, portions of each segment extend beyond the seam regions 2403 into another segment so that the overlap/underlap region formed at the seam increases the mechanical strength of the connection between segments 2401 and 2402. Furthermore, a portion of the RF elements 2422 is illustrated on an integral radial pitch between segments (e.g., across seam region 2403) and up to the last ring of RF elements 2420. As discussed herein, in embodiments, the RF elements 2422 form concentric rings relative to aperture pattern origin 2424.

In one embodiment, a vacuum may be used to hold one or more segments in position on fixture 2450, such as segment 2401 aligned using fiducials 2410, while a segment not held by vacuum, such as segment 2402 is move into position using fiducials 2412 and then placed under vacuum to hold it in position. In embodiments, one or more vacuums of fixture 2450 holds down segments independently to allow alignment one by one. When all segments are in the correct place, they can all be held down by their respective vacuums.

In embodiments, the first three placed segments (e.g., first three quadrants of antenna aperture) are placed as discussed above by placing them in a rough alignment, using fiducial sets to achieve a highly accurate alignment with respect to each other and an aperture pattern origin, placed, and then held by vacuum to an assembly fixture. However, due to the overlap/underlap at each edge of the aperture segments, the fourth and final aperture segment cannot be simply moved into position, as such movement would cause smearing of an adhesive seal and/or scraping of various aperture segment layers (e.g., metal layers). Therefore, in one embodiment, as a final segment is moved into position relative to its fiducial set, a negative space 2455 is created in the fixture 2450 so that the final segment can be angled while moved into place (e.g., dipping an underlap edge into the negative space), and then leveling the final segment brining the underlap edge upwards and an overlap region downwards into contact with its adjacent segments edges. In embodiments, the negative space 2455 may be a dropaway, cutout, machined depression, etc. in fixture's 2450 surface.

Figure 25:
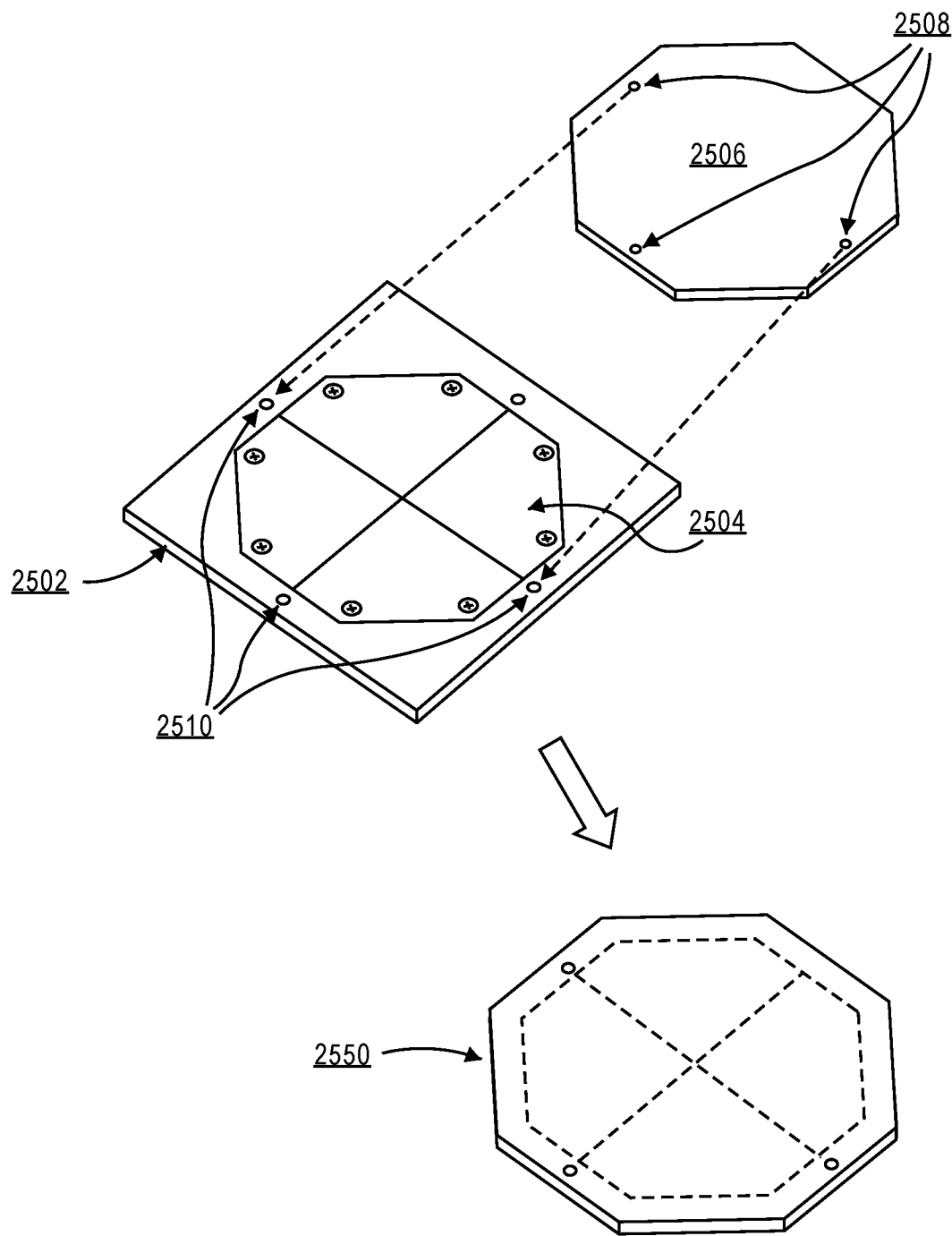
FIG. 25 illustrates one embodiment of all segments assembled on a fixture and then joined to a carrier structure.

FIG. 25 illustrates one embodiment of all segments assembled on a fixture and then joined to a structure. Segments 2504 are joined as discussed above, and held in place a minimum duration of time on assembly fixture 2502 to ensure that the adhesive bonding agents applied to segment seam regions has set. In one embodiment, the duration of time may be a minimum time until the adhesive is fully set. In another embodiment, the adhesive need not be fully set, but should be set to ensure green strength to ensure the segments stay co-planar to one another during subsequent movement and/or joining of the segments 2504 to structure 2506.

In embodiments, after the duration of time has passed, a structure 2506, such as a carrier structure, an RF structure, a radome assembly, an electromagnetic protectant, etc., is placed over segments 2504. In embodiments, the structure 2506 includes mechanical alignment features 2508 that enable it to be aligned over segments 2504 with corresponding fixture alignment features 2510. For example, alignment features 2508 may be mechanical alignment features, such as pins, screws, etc., that join and secure structure to segment assembly fixture 2502 when the segments are joined to structure 2506.

In one embodiment, the segments 2504 are further bonded to the structure 2506. In one embodiment, after the segments 2504 are placed on the assembly fixture 2502 and form the RF aperture, they are held in position, such as using the independent vacuums discussed above. Although not shown, on one side of structure 2506 is a vacuum port, an adhesive, or some other method of picking up the joined segments. Then, once lowered, the segments 2504 are held to the structure 2506 for example by bonding to the structure's adhesive (e.g., a pressure sensitive adhesive). When bonding between the structure 2506 and the segments 2504 is complete, the individual vacuums holding each segment are vented so that the structure 2506 can be picked up with the segments 2504 attached. The strength of the bond between the seams of the aperture segments ensures that the segments hold registration to each other and to the aperture pattern origin (e.g., maintain planarity and positioning of segments of the cylindrical RF aperture), which in turn hold registration to the mechanical alignment features 2508 in the carrier (e.g., are stably maintained in structure 2506).

This structure 2506 can be moved and aligned in turn to another structure, such as another RF structure, radome structure, or waveguide, and integrated into one of the system discussed in greater detail below.

Figure 26:
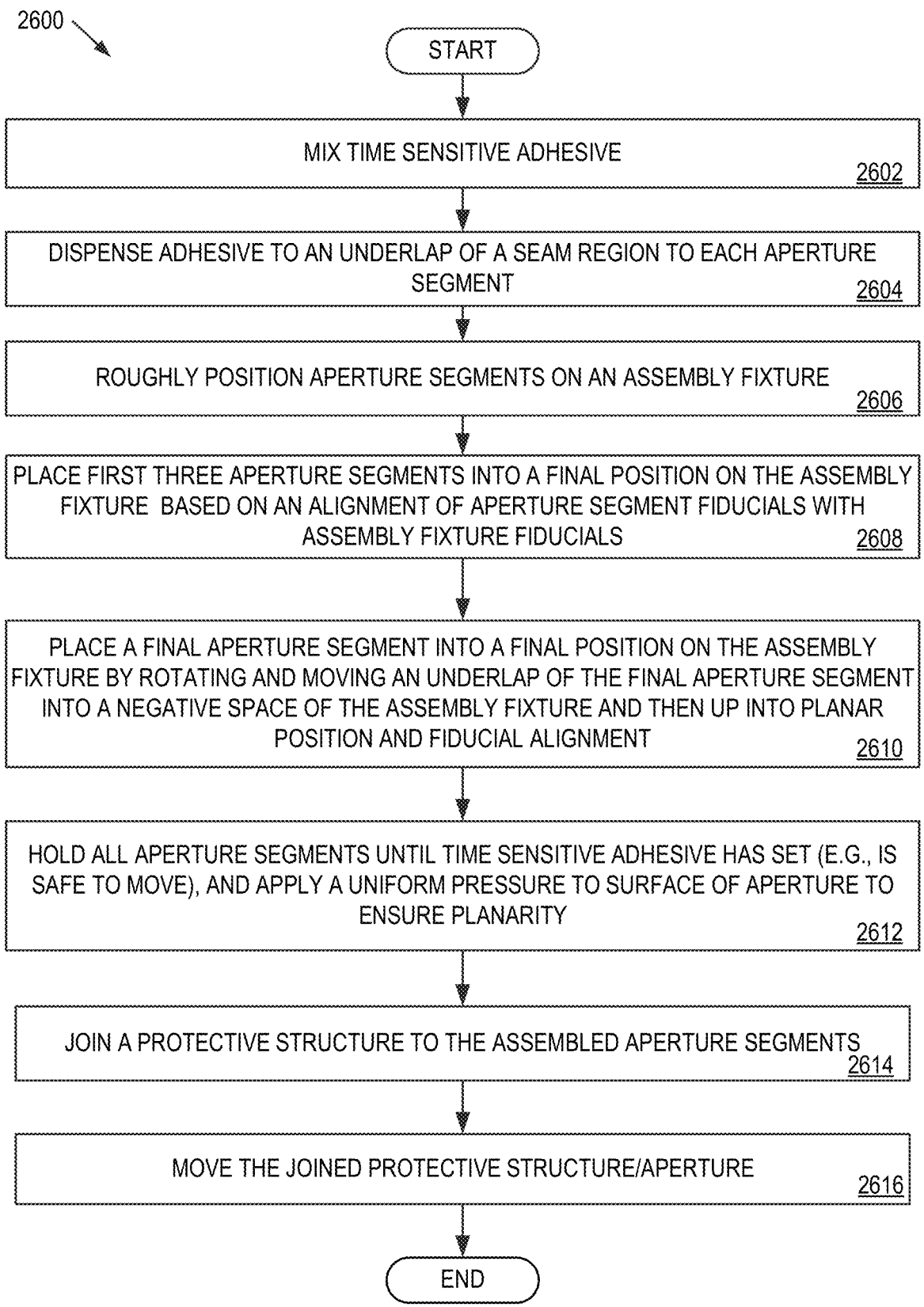
FIG. 26 illustrates one embodiment of a method for assembling aperture segments into a cylindrical feed aperture.

FIG. 26 illustrates one embodiment of a method 2600 for assembling aperture segments into a cylindrical feed aperture. In one embodiment, the method may be performed by an automated system, which may perform the operations discussed herein without human intervention. In another embodiment, the method is performed with user controlled machinery, such as pick and place systems for handling segments, user controlled robots for aligning and placing segments, optical systems for lining up fiducials, as well as other systems. In yet another embodiment, a combination of autonomous and user controlled assembly systems may be used in the assembly method discussed below.

The assembly process begins by mixing an adhesive prior to placing aperture segments (block 2602). In one embodiment, the adhesive is a time sensitive adhesive having a selected cure time. In one embodiment, the selected cure time corresponds with a time that will be used to place the aperture segments in their respective final position on an assembly fixture. Furthermore, the time sensitive adhesive may be the adhesive discussed above, which in embodiments is either conductive or not conductive. Furthermore, the mixing may be performed, for example by an orbital mixer, for a sufficient amount of time to ensure equal distribution of components throughout the adhesive compound. The mixed time sensitive adhesive is then dispensed, for example by a dispensing robot capable of accurately applying a given volume of adhesive to a given area, to an underlap of a seam region to each aperture segment (block 2604).

The aperture segments are then roughly positioned on an assembly fixture (processing block 2606). In one embodiment, the assembly fixture may include pins, slots, edges, etc. that server to provide a starting position for each segment. In one embodiment, a pick and place device, such as a user controlled or autonomously controlled robot may place the segments in their rough positions on the assembly fixture.

A first three aperture segments are then placed into their final position on the assembly fixture based on an alignment of aperture segment fiducials with assembly fixture fiducials (block 2608). In one embodiment, as discussed above, each segment has a first edge for joining with a complementary edge of another segment, where the first edge has an overlapping patch glass and conductive material (e.g., metal layer) that extends beyond a conductive adhesive seal bonding the patch to the iris of the segment, and an iris and conductive material (e.g., metal layer) that extends just past the conductive adhesive seal bonding the patch to the iris. The overlap results in a portion of the segment that extends beyond a seam formed by the two segments when joined (e.g., by joining the overlap region of the first segment's edge with an underlap region that extends beyond the other segments seam region). An overlap region is created between each of the seams where the segments are joined, resulting in an improved mechanical strength of the connection between the segments. Furthermore, since the overlap regions are composed of conductive material, the iris metal plane is brought out on one side into the overlap region, and on the other side of the overlap the iris plane is brought out under the border seal. That is, the connection crosses through the conductive border seal to a metal plane on the patch glass, which then laps over the iris metal plane to form the other portion of the overlap.

In one embodiment, due to the overlapping nature of the segments, and since each segment is identical, the final segment is placed in the aperture by rotating and moving an underlap of the final aperture segment into a negative space of the assembly fixture and then up into planar and fiducial alignment (block 2610). As discussed above, the movement and placement of the aperture segments into position may be performed by automated, user controlled, or a combination of different assembly systems.

In one embodiment, blocks 2606-2610 of the assembly method may be performed simultaneously, or nearly simultaneously, for each aperture segment. In this embodiment, each aperture segment is placed on the surface of the fixture assembly. In one embodiment, a rough positioning of the placed aperture segments includes placing each aperture segment in a rotated position such that an underlap of each aperture segment is placed in an approximate final position with an overlap of each aperture segment raised above the surface of the fixture assembly. In this embodiment, each aperture segment is then rotated and aligned, simultaneously or nearly simultaneously, so that the overlap of each segment is lowered into an overlap region with the corresponding underlap of an adjacent aperture segment. As discussed herein, the alignment of the aperture segments in their respective final positions is based on the alignment of fiducials of each aperture segment with corresponding fiducial markings on the surface of the fixture assembly.

In either embodiment, all aperture segments, after being placed and aligned, are then held in position until the time sensitive adhesive has set (block 2612). In one embodiment, a vacuum is individually applied to each segment to hold the segments in place on an assembly fixture. Further, another vacuum may be applied to a surface of the assembled RF aperture segments, which applies a uniform and consistent pressure across the surface of the assembled RF aperture segments. In embodiments, the vacuums applied to the segments and surface ensure that registration is maintained between the segments, with respect to an aperture pattern origin, and with respect to the radial concentric RF elements of the aperture segments. Furthermore, the seam regions are sealed by the adhesives to ensure protection from external and environmental factors. Finally, the adhesive and overlapping structure ensure an electrical connection between segment layers.

A protective cover may then be joined with the assembled aperture segments after the time sensitive adhesive has set (block 2614). As discussed above, the protective cover may be a carrier, ESD mitigation structure (e.g., one or more layers of protective and insulating foam, a shroud, a vacuum bag, etc.), radome structure, an RF structure, or a combination of protective structures. Furthermore, the protective cover may be joined via an adhesive, mechanical fastening, or other method. The fully formed cylindrical RF aperture may then be moved by moving the protective cover (block 2616).

An Example System Embodiment

In one embodiment, the combined segments forming an aperture can be used in a television system that operates in conjunction with a set top box. For example, in the case of a dual reception antenna, satellite signals received by an antenna utilizing one or more of the formed apertures are provided to a set top box (e.g., a DirecTV receiver) of a television system. More specifically, the combined antenna operation is able to simultaneously receive RF signals at two different frequencies and/or polarizations. That is, one sub-array of elements is controlled to receive RF signals at one frequency and/or polarization, while another sub-array is controlled to receive signals at another, different frequency and/or polarization. These differences in frequency or polarization represent different channels being received by the television system. Similarly, the two antenna arrays can be controlled for two different beam positions to receive channels from two different locations (e.g., two different satellites) to simultaneously receive multiple channels.

Figure 27:
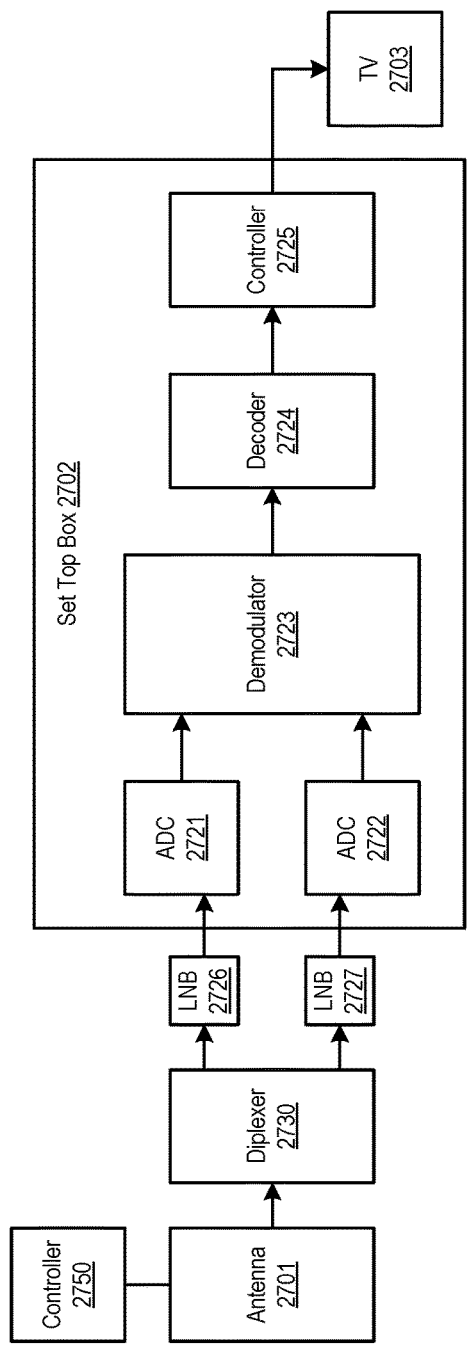
FIG. 27 is a block diagram of one embodiment of a communication system that performs dual reception simultaneously in a television system.

FIG. 27 is a block diagram of one embodiment of a communication system that performs dual reception simultaneously in a television system. Referring to FIG. 27, antenna 2701 includes two spatially interleaved antenna apertures operable independently to perform dual reception simultaneously at different frequencies and/or polarizations as described above. Note that while only two spatially interleaved antenna operations are mentioned, the TV system may have more than two antenna apertures (e.g., 3, 4, 5, etc. antenna apertures).

In one embodiment, antenna 2701, including its two interleaved slotted arrays, is coupled to diplexer 2730. The coupling may include one or more feeding networks that receive the signals from elements of the two slotted arrays to produce two signals that are fed into diplexer 2730. In one embodiment, diplexer 2730 is a commercially available diplexer (e.g., model PB1081WA Ku-band sitcom diplexer from A1 Microwave).

Diplexer 2730 is coupled to a pair of low noise block down converters (LNBs) 2726 and 2727, which perform a noise filtering function, a down conversion function, and amplification in a manner well-known in the art. In one embodiment, LNBs 2726 and 2727 are in an out-door unit (ODU). In another embodiment, LNBs 2726 and 2727 are integrated into the antenna apparatus. LNBs 2726 and 2727 are coupled to a set top box 2702, which is coupled to television 2703.

Set top box 2702 includes a pair of analog-to-digital converters (ADCs) 2721 and 2722, which are coupled to LNBs 2726 and 2727, to convert the two signals output from diplexer 2730 into digital format.

Once converted to digital format, the signals are demodulated by demodulator 2723 and decoded by decoder 2724 to obtain the encoded data on the received waves. The decoded data is then sent to controller 2725, which sends it to television 2703.

Controller 2750 controls antenna 2701, including the interleaved slotted array elements of both antenna apertures on the single combined physical aperture.

An Example of a Full Duplex Communication System

Figure 28:
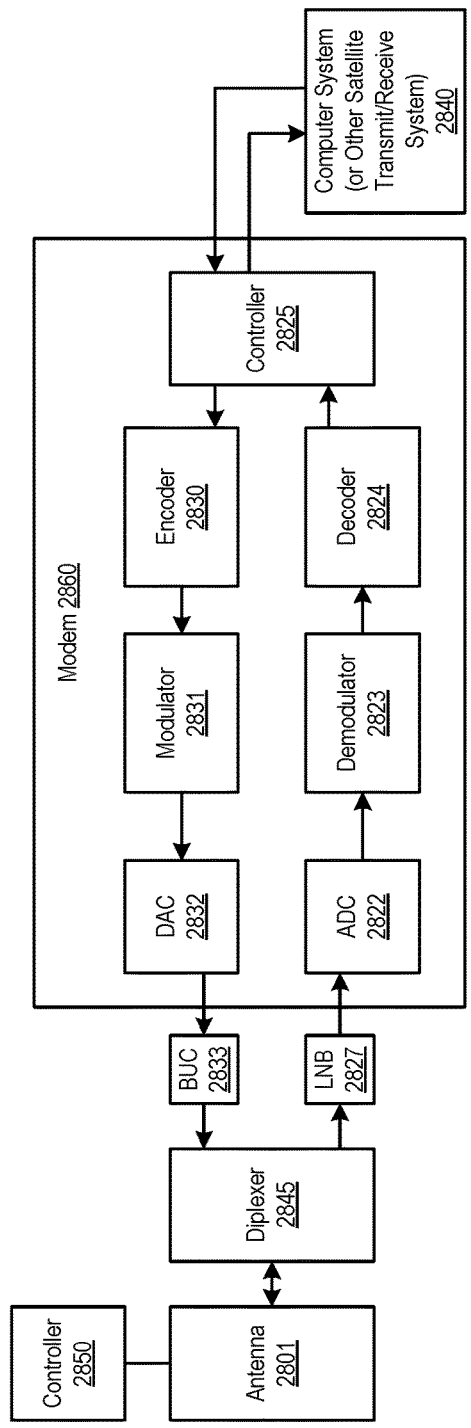
FIG. 28 is a block diagram of another embodiment of a communication system having simultaneous transmit and receive paths.

In another embodiment, one or more of the apertures created in accordance with the discussion herein may be used in a full duplex communication system. FIG. 28 is a block diagram of another embodiment of a communication system having simultaneous transmit and receive paths. While only one transmit path and one receive path are shown, the communication system may include more than one transmit path and/or more than one receive path.

Referring to FIG. 28, antenna 2801 includes two spatially interleaved antenna arrays operable independently to transmit and receive simultaneously at different frequencies as described above. In one embodiment, antenna 2801 is coupled to diplexer 2845. The coupling may be by one or more feeding networks. In one embodiment, in the case of a radial feed antenna, diplexer 2845 combines the two signals and the connection between antenna 2801 and diplexer 2845 is a single broad-band feeding network that can carry both frequencies.

Diplexer 2845 is coupled to a low noise block down converter (LNBs) 2827, which performs a noise filtering function and a down conversion and amplification function in a manner well-known in the art. In one embodiment, LNB 2827 is in an out-door unit (ODU). In another embodiment, LNB 2827 is integrated into the antenna apparatus. LNB 2827 is coupled to a modem 2860, which is coupled to computing system 2840 (e.g., a computer system, modem, etc.).

Modem 2860 includes an analog-to-digital converter (ADC) 2822, which is coupled to LNB 2827, to convert the received signal output from diplexer 2845 into digital format. Once converted to digital format, the signal is demodulated by demodulator 2823 and decoded by decoder 2824 to obtain the encoded data on the received wave. The decoded data is then sent to controller 2825, which sends it to computing system 2840.

Modem 2860 also includes an encoder 2830 that encodes data to be transmitted from computing system 2840. The encoded data is modulated by modulator 2831 and then converted to analog by digital-to-analog converter (DAC) 2832. The analog signal is then filtered by a BUC (upconvert and high pass amplifier) 2833 and provided to one port of diplexer 2845. In one embodiment, BUC 2833 is in an out-door unit (ODU).

Diplexer 2845 operating in a manner well-known in the art provides the transmit signal to antenna 2801 for transmission.

Controller 2850 controls antenna 2801, including the two arrays of antenna elements on the single combined physical aperture.

Note that the full duplex communication system shown in FIG. 20 has a number of applications, including but not limited to, internet communication, vehicle communication (including software updating), etc.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method of assembling an antenna aperture from a plurality of antenna aperture segments, comprising:
   providing the plurality of antenna aperture segments, each of the plurality of antenna aperture segments comprising an overlap and an underlap wherein the overlap of each of the antenna aperture segments is complementary to the underlap of another of the antenna aperture segments;
placing a first aperture segment adjacent to a second aperture segment on a fixture assembly to partially form the antenna aperture, wherein the overlap of the first aperture segment overlaps the complementary underlap of the second aperture segment at a seam;
joining the overlap of the first aperture segment to the underlap of the second aperture segment to partially form the antenna aperture; and
placing and joining the rest of the plurality of antenna aperture segments to the partially formed antenna aperture to form the antenna aperture.

2. The method of claim 1, wherein a conductor of a patch of the first aperture segment overlaps a conductor of an iris of the second aperture segment in an overlap region created when the first aperture segment is placed adjacent to the second aperture segment to partially form the antenna aperture.

3. The method of claim 2, wherein the overlap of the first aperture segment comprises a patch glass and a patch metal under the patch glass, wherein each of the patch glass and the patch metal extend beyond a conductive seal joining the patch with an iris of the first aperture segment,
wherein the complementary underlap of the second aperture segment comprises an iris glass and an iris metal above the iris glass, wherein each of the iris glass and the iris metal extend beyond a conductive seal joining the iris with a patch of the second aperture segment; and
wherein the patch metal of the first aperture segment overlaps the iris metal of the second aperture segment in the overlap region when the first aperture segment is placed adjacent to the second aperture segment to partially form the antenna aperture.

4. The method of claim 1, wherein placing the first aperture segment relative to the second aperture segment further comprises:
placing the first aperture segment in a preliminary position on a surface of the fixture assembly;
aligning fiducial markings on the first aperture segment with corresponding fiducial markings on the surface of the fixture assembly to place the first aperture segment into a final position with respect to the antenna aperture;
lowering the first aperture segment onto the surface of the fixture assembly; and
holding the first aperture segment in the final position while other aperture segments are placed and aligned on the fixture assembly.

5. The method of claim 4, wherein the first aperture segment is placed in the preliminary position using retractable pins of the fixture assembly.

6. The method of claim 4, wherein the fiducial markings on the first aperture segment are aligned with the corresponding fiducial markings on the surface of the fixture assembly using an optical system.

7. The method of claim 4, wherein the fiducial markings on the first aperture segment are transparent or semitransparent.

8. The method of claim 4, further comprising:
repeating the placing, aligning, and holding for each aperture segment of the antenna aperture except for a last aperture segment;
placing the last aperture segment in a rough alignment with a corresponding set of fixture assembly fiducials;
moving and rotating the underlap of the last aperture segment into a negative space of the fixture assembly, wherein the negative space corresponds with an area under the overlap of an aperture segment with which the last aperture segment will be joined; and
lowering the last aperture segment to the surface of the fixture assembly when the movement and rotation causes fiducials of the last aperture segment to come into alignment with corresponding fiducials of the fixture assembly.

9. The method of claim 1, further comprising:
placing each aperture segment of the antenna aperture on a surface of the fixture assembly, wherein each aperture segment is in a rotated position such that the underlap of each aperture segment is placed in an approximate final position of said aperture segment and the overlap is raised above the fixture assembly;
rotating and aligning each aperture segment into a final position, wherein the rotating and aligning lowers the overlap of each segment to form an overlap region with a corresponding underlap of an adjacent aperture segment, and wherein the alignment is based on fiducial markings of said each aperture with corresponding fiducial markings on the surface of the fixture assembly; and
holding each aperture segment in the final position.

10. The method of claim 9, wherein the placing, rotating, and aligning of all of the plurality of aperture segments are performed simultaneously, or nearly simultaneously.

11. The method of claim 1, wherein the overlap of the first aperture segment is bonded with an adhesive applied to the underlap of the second aperture segment, and wherein the adhesive acts as a barrier between an exterior of the antenna aperture and an interior of the antenna aperture at the seam.

12. The method of claim 11, wherein the adhesive is a non-conductive adhesive.

13. The method of claim 12, wherein the non-conductive adhesive forms a choke that prevents radio frequency (RF) leakage at the seam.

14. The method of claim 11, wherein the adhesive is a conductive adhesive.

15. The method of claim 14, wherein the conductive adhesive creates a contiguous ground plane between iris metal layers of joined aperture segments.

16. The method of claim 11, wherein the adhesive is a time sensitive adhesive that forms a bond after a predetermined length of time, and wherein placing of all of the aperture segments of the plurality of aperture segments is completed before the predetermined length of time.

17. The method of claim 16, further comprising:
holding all of the aperture segments of the plurality of aperture segments to the fixture assembly while the time sensitive adhesive cures; and
applying a consistent and uniform pressure to a surface of the aperture segments while the aperture segments are being held.

18. The method of claim 16, further comprising:
after passage of the predetermined length of time, joining a protective structure to a surface of the antenna aperture.

19. The method of claim 18, wherein the protective structure comprises one of a carrier structure, a Radio Frequency (RF) structure, or a radome structure.

20. The method of claim 16, wherein the predetermined length of time comprises a length of time sufficient for the time sensitive adhesive to fully cure.

21. The method of claim 16, wherein the predetermined length of time comprises a length of time sufficient to ensure stability of the bond between the first aperture segment and the second aperture segment, and less than a length of time sufficient for the time sensitive adhesive to fully cure.

22. The method of claim 1, wherein the antenna aperture is a cylindrical radio frequency (RF) antenna aperture formed by four identical aperture segment quadrants.

\* \* \* \* \*